(12) United States Patent
Kim et al.

(10) Patent No.: US 12,451,450 B2
(45) Date of Patent: Oct. 21, 2025

(54) NON-VOLATILE MEMORY DEVICE

(71) Applicant: Samsung Electronics Co., Ltd., Suwon-si (KR)

(72) Inventors: Changhun Kim, Suwon-si (KR); Jaeick Son, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 533 days.

(21) Appl. No.: 17/983,469

(22) Filed: Nov. 9, 2022

(65) Prior Publication Data
US 2023/0387053 A1    Nov. 30, 2023

(30) Foreign Application Priority Data

May 25, 2022    (KR) .................. 10-2022-0064340

(51) Int. Cl.
| | |
|---|---|
| *H01L 23/00* | (2006.01) |
| *H01L 25/065* | (2023.01) |
| *H01L 25/18* | (2023.01) |

(52) U.S. Cl.
CPC .............. *H01L 24/06* (2013.01); *H01L 24/08* (2013.01); *H01L 25/0657* (2013.01); *H01L 25/18* (2013.01); *H01L 2224/06515* (2013.01); *H01L 2224/08145* (2013.01); *H01L 2924/1431* (2013.01); *H01L 2924/14511* (2013.01); *H01L 2924/19041* (2013.01); *H01L 2924/19043* (2013.01); *H01L 2924/19104* (2013.01)

(58) Field of Classification Search
None
See application file for complete search history.

(56) References Cited

U.S. PATENT DOCUMENTS

| | | | | |
|---|---|---|---|---|
| 11,664,361 | B2 * | 5/2023 | Kim ................. | H10D 88/00 |
| | | | | 257/314 |
| 2020/0321349 | A1 | 10/2020 | Kwon et al. | |
| 2020/0350258 | A1 * | 11/2020 | Lee .................. | H01L 24/80 |
| 2020/0388336 | A1 * | 12/2020 | Yun .................. | G11C 16/08 |
| 2021/0082896 | A1 | 3/2021 | Harashima et al. | |
| 2021/0082897 | A1 | 3/2021 | Okada et al. | |

FOREIGN PATENT DOCUMENTS

| | | |
|---|---|---|
| CN | 109461737 A | 3/2019 |
| CN | 112219289 A | 1/2021 |
| KR | 2020/0116765 A | 10/2020 |
| KR | 2021/0033439 A | 3/2021 |

* cited by examiner

*Primary Examiner* — Hung K Vu
(74) *Attorney, Agent, or Firm* — Fish & Richardson P.C.

(57) ABSTRACT

A non-volatile memory device includes a first chip including a first substrate and a circuit element, and a second chip stacked on the first chip. The second chip includes a second substrate including a first cell region and a second cell region, gate electrodes stacked on the second cell region of the second substrate, wherein the gate electrodes are between the second substrate and the first chip, an upper insulating layer configured to cover the second substrate, dummy pads and input/output pads on the upper insulating layer, a cover layer on the upper insulating layer to cover the dummy pads, wherein the cover layer is configured to expose the input/output pads to an outside, and dummy contact plugs on one side of the second substrate, wherein the dummy contact plugs are configured to penetrate the upper insulating layer and electrically connect the dummy pads and the circuit element.

20 Claims, 21 Drawing Sheets

NON-VOLATILE MEMORY DEVICE

CROSS-REFERENCE TO RELATED APPLICATION

This application claims priority under 35 U.S.C. § 119 to Korean Patent Application No. 10-2022-0064340 filed on May 25, 2022, in the Korean Intellectual Property Office, the disclosure of which is incorporated by reference herein in its entirety.

FIELD

Some example embodiments of the inventive concepts relate to a semiconductor device, including a non-volatile memory device having a three-dimensional structure.

BACKGROUND

Memory devices are used to store data and are classified into a volatile memory device and a non-volatile memory device. As an example of the non-volatile memory device, a flash memory device may be used in a mobile phone, a digital camera, a mobile computer device, a stationary computer device, and other devices. Recently, with the multi-functionalization of information and communication devices, high-capacity and high-integration memory devices have been desired or required. Accordingly, a three-dimensional (3D) non-volatile memory device including a plurality of word lines vertically stacked on a substrate has been proposed. As the number of word lines stacked on the substrate in the 3D non-volatile memory device is increased, an increase in the capacity of a passive element included in a peripheral circuit region is desired or required.

SUMMARY

Some example embodiments of the inventive concepts provide a non-volatile memory device for providing a high-capacity passive element while reducing or minimizing an increase in chip size.

According to an example embodiment, a non-volatile memory device includes a first chip including a first substrate and a circuit element, the first substrate includes a first peripheral circuit region and a second peripheral circuit region, and the circuit element is on the first peripheral circuit region of the first substrate, and a second chip stacked on the first chip. The second chip includes a second substrate including a first cell region and a second cell region, the first cell region is configured to overlap the first peripheral circuit region, and the second cell region is configured to overlap the second peripheral circuit region. Gate electrodes are stacked on the second cell region of the second substrate, the gate electrodes are between the second substrate and the first chip, an upper insulating layer is configured to cover the second substrate, dummy pads and input/output pads on the upper insulating layer, a cover layer is on the upper insulating layer to cover the dummy pads, the cover layer is configured to expose the input/output pads to an outside, and dummy contact plugs on one side of the second substrate, and the dummy contact plugs are configured to penetrate the upper insulating layer and electrically connect the dummy pads and the circuit element.

According to an example embodiment, a non-volatile memory device includes a first chip including a first substrate, a circuit element and first bonding metals, the first substrate includes a first peripheral circuit region and a second peripheral circuit region, the circuit element is on the first peripheral circuit region of the first substrate, the first bonding metals are over the first peripheral circuit region of the first substrate, and the first bonding metals are electrically connected to the circuit element. The device includes a second chip stacked on the first chip, the second chip includes a second substrate including a first cell region and a second cell region, the first cell region configured to overlap the first peripheral circuit region, and the second cell region configured to overlap the second peripheral circuit region, gate electrodes stacked on the second cell region of the second substrate, the gate electrodes located between the second substrate and the first chip, dummy pads and input/output pads on the second substrate, a cover layer on the second substrate to cover the dummy pads, the cover layer configured to expose the input/output pads to an outside, dummy contact plugs configured to penetrate the second substrate and electrically connect the dummy pads and the circuit element, and second bonding metals electrically connected to the dummy contact plugs, the second bonding metals configured to contact the first bonding metals of the first chip.

BRIEF DESCRIPTION OF THE FIGURES

The above and other example features of the inventive concepts will become apparent by describing in detail example embodiments thereof with reference to the accompanying drawings.

DETAILED DESCRIPTION

Hereinafter, some example embodiments of the inventive concepts will be described clearly and in detail to such an extent that those skilled in the art may implement the example embodiments.

Figure 1:
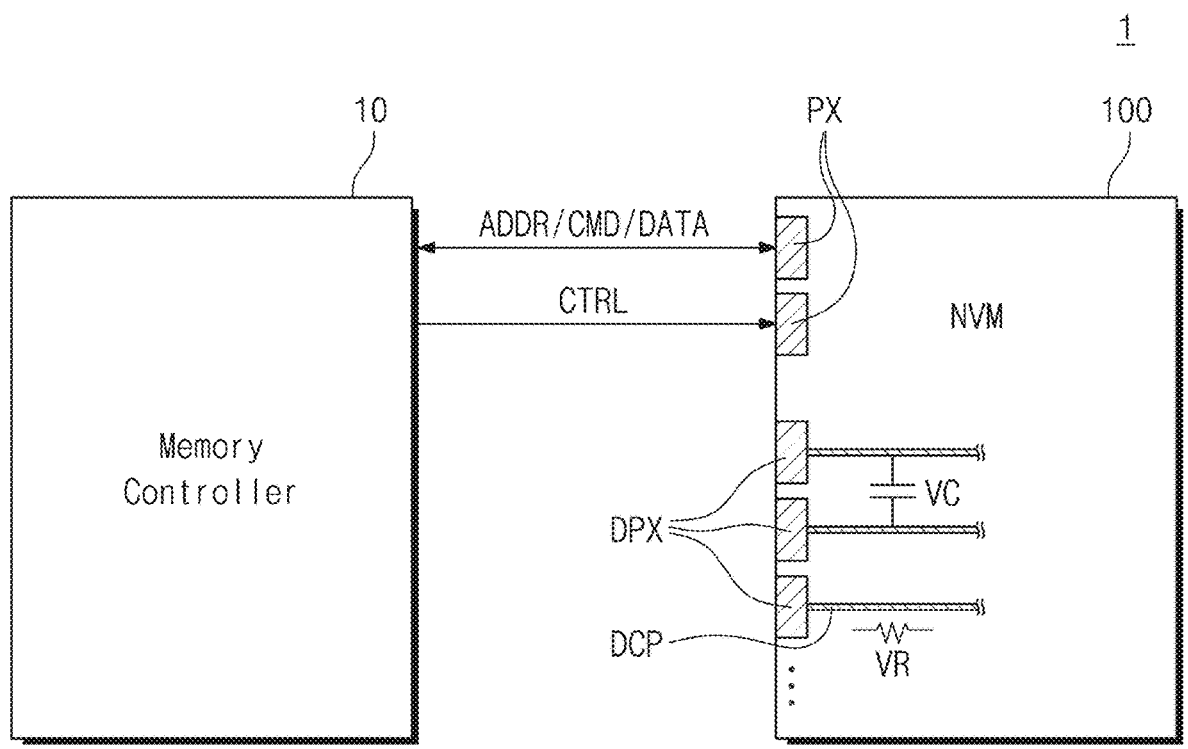
FIG. 1 is a block diagram illustrating a semiconductor device according to an example embodiment of the inventive concepts.

FIG. 1 is a block diagram illustrating a semiconductor device 1 according to an example embodiment of the inventive concepts. Referring to FIG. 1, the semiconductor device 1 may include a memory controller 10 and a non-volatile memory device 100.

The memory controller 10 may transmit an address signal ADDR, a command signal CMD, and a control signal CTRL to the non-volatile memory device 100 to store data DATA in the non-volatile memory device 100 or read the data DATA stored in the non-volatile memory device 100. The non-volatile memory device 100 may store the data DATA, or may transmit the stored data DATA to the memory controller 10, in response to the signals received from the memory controller 10.

The non-volatile memory device 100 may include input/output pads PX, and the memory controller 10 and the non-volatile memory device 100 may be connected with each other through the input/output pads PX. For example, the non-volatile memory device 100 may receive the signals ADDR, CMD, and CTRL and the data DATA from the memory controller 10 through the input/output pads PX, and the received signals ADDR, CMD, and CTRL and the received data DATA may be transferred to a peripheral circuit in the non-volatile memory device 100.

The non-volatile memory device 100 may include a first chip and a second chip vertically stacked on each other. For example, the first chip may have the peripheral circuit formed therein, and the second chip stacked on the first chip may have memory cells formed therein.

In an example embodiment, the non-volatile memory device 100 may include a dummy pad DPX not connected to an external device, such as the memory controller 10, and a dummy contact plug DCP connected to the dummy pad DPX. The dummy pad DPX and the dummy contact plug DCP may be formed in the second chip. The dummy pad DPX and the dummy contact plug DCP formed in the second chip may be vertically connected to the peripheral circuit formed in the first chip and may constitute a vertical capacitor VC or a vertical resistor VR.

By forming the vertical capacitor VC or the vertical resistor VR in the second chip using the dummy pad DPX not connected to the external device and the dummy contact plug DCP, the non-volatile memory device 100 according to the example embodiment may provide a high-capacity passive element while reducing or minimizing an increase in chip size.

Figure 2:
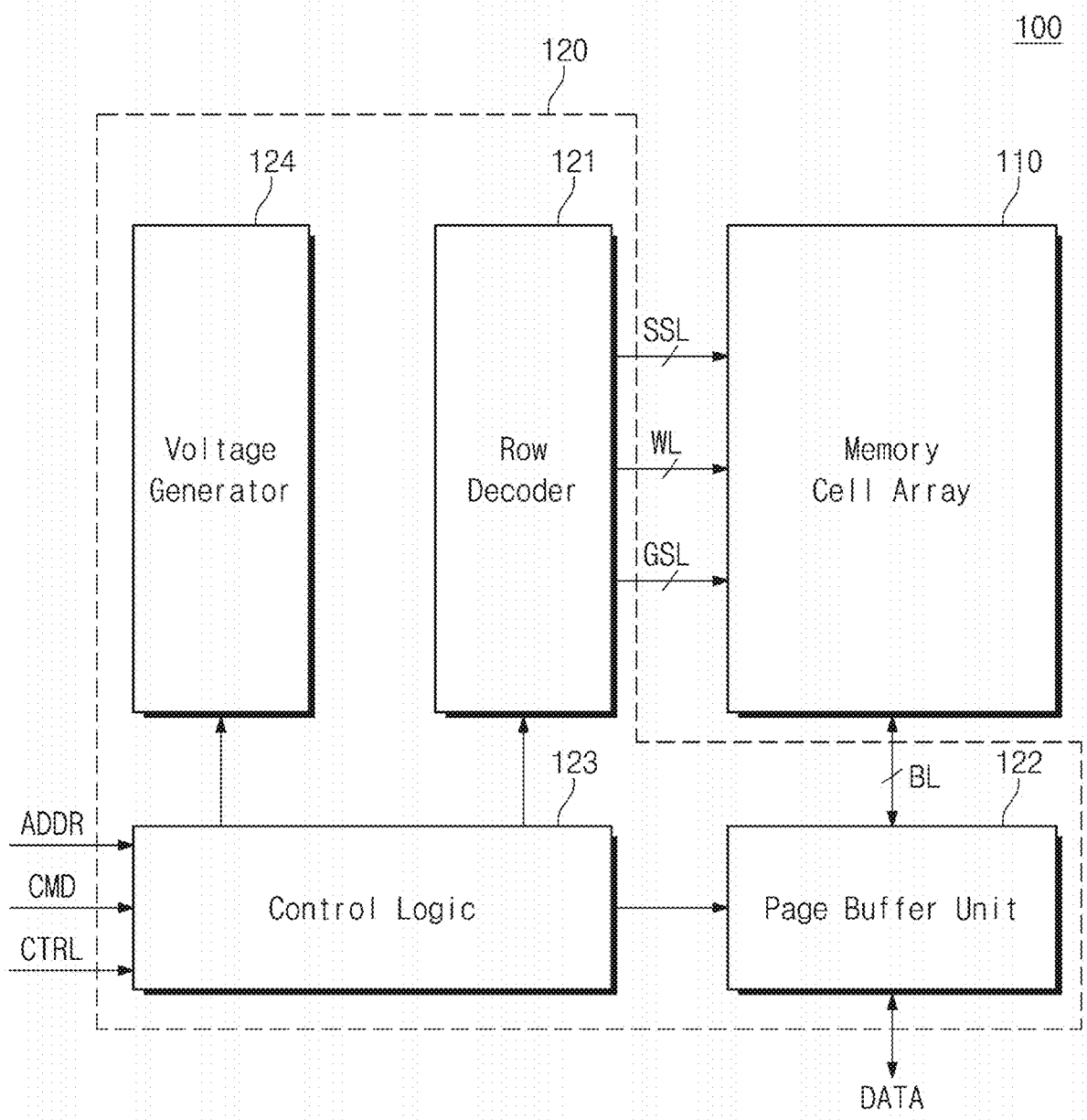
FIG. 2 is a block diagram illustrating a non-volatile memory device of FIG. 1 in more detail.
Figure 3:
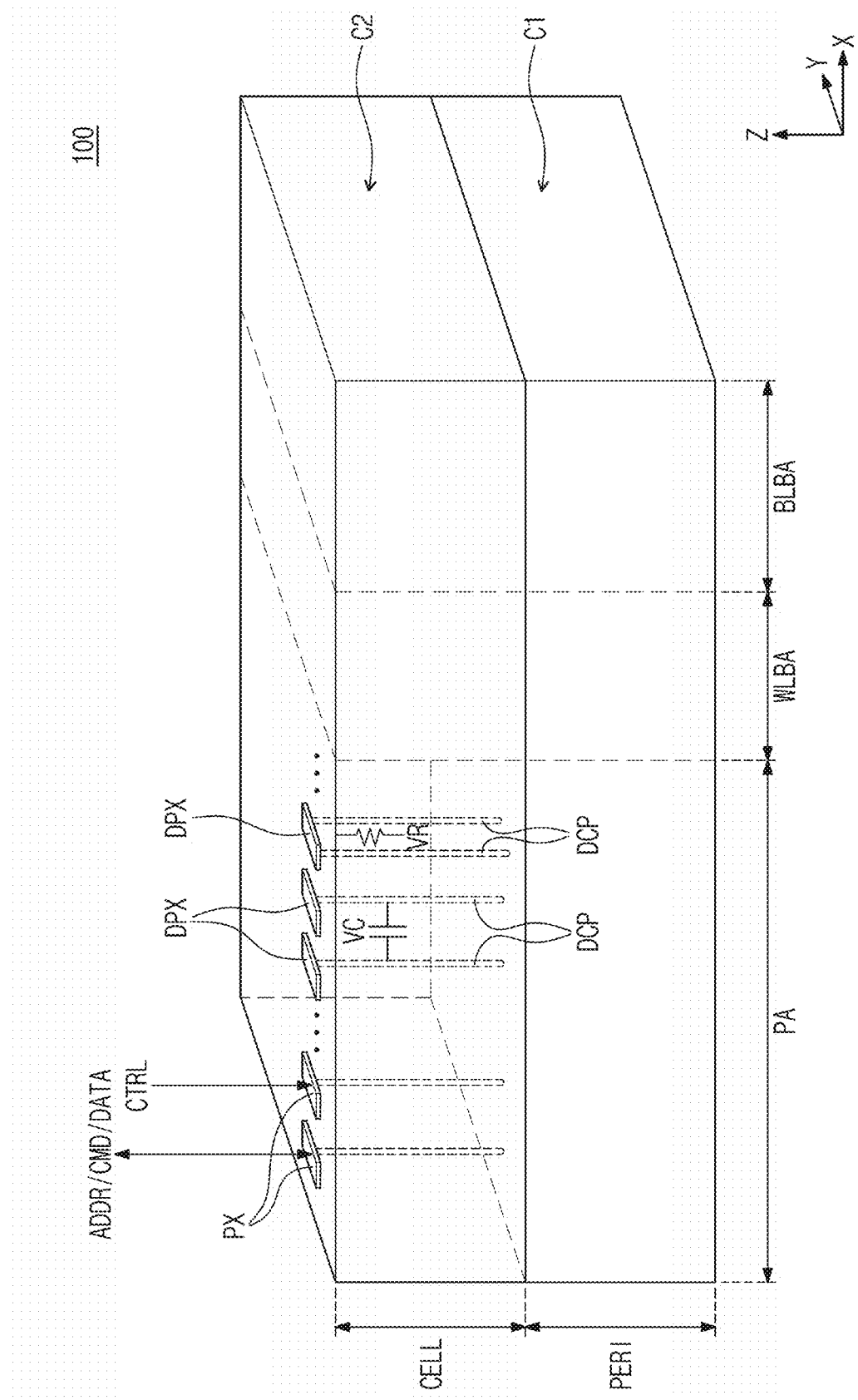
FIG. 3 is a perspective view illustrating an example embodiment of the non-volatile memory device including first and second chips vertically stacked on each other.

FIG. 2 is a block diagram illustrating the non-volatile memory device 100 of FIG. 1 in more detail, and FIG. 3 is a perspective view illustrating one example of the non-volatile memory device 100 including the first and second chips vertically stacked on each other.

Referring to FIGS. 2 and 3, the non-volatile memory device 100 may include a memory cell array 110 and a peripheral circuit 120, and the peripheral circuit 120 may include a row decoder 121, a page buffer unit 122, control logic 123, and a voltage generator 124. The memory cell array 110 may be formed in the second chip C2, the peripheral circuit 120 may be formed in the first chip C1, and the second chip C2 and the first chip C1 may be bonded to each other to implement the non-volatile memory device 100.

In more detail, the memory cell array 110 may be connected to the page buffer unit 122 through bit lines BL and may be connected to the row decoder 121 through word lines WL, string selection lines SSL, and ground selection lines GSL. The memory cell array 110 may include a plurality of memory cells. For example, the memory cells may be flash memory cells. However, the inventive concepts are not limited thereto, and the plurality of cells may be resistive memory cells, such as resistive RM (ReRAM), phase change RAM (PRAM), or magnetic RAM (MRAM).

The memory cell array 110 may include a three-dimensional memory cell array. The three-dimensional memory cell array may include a plurality of NAND strings, and each of the NAND strings may include memory cells connected to respective word lines vertically stacked on a substrate.

In response to a row address signal X-ADDR, the row decoder 121 may select one of a plurality of memory blocks, may select one of word lines WL of the selected memory block, and may select one of the plurality of string selection lines SSL.

In response to a column address signal Y-ADDR, the page buffer unit 122 may select some of the bit lines BL. The page buffer unit 122 may operate as a write driver or a sense amplifier depending on an operating mode.

The control logic 123 may control various types of operations in the non-volatile memory device 100 overall. For example, the control logic 123 may program the data DATA in the memory cell array 110, or may read the data from the memory cell array 110, based on the command signal CMD, the address signal ADDR, and the control signal CTRL.

The voltage generator 124 may generate various types of voltages for performing a program operation, a read operation, and an erase operation on the memory cell array 110. For example, the voltage generator 124 may generate word line voltages, such as a program voltage, a read voltage, a pass voltage, an erase verification voltage, or a program verification voltage. In addition, the voltage generator 124 may further generate a string selection line voltage and a ground selection line voltage.

Although not illustrated, the peripheral circuit 120 may further include a data input/output circuit or input/output interface, column logic, a pre-decoder, a temperature sensor, a command decoder, an address decoder, and the like.

In an example embodiment, the non-volatile memory device 100 may have a chip-to-chip (C2C) structure. The C2C structure may be implemented by manufacturing the first chip C1 including a peripheral circuit region PERI on a first wafer, manufacturing the second chip C2 including a cell region CELL on a second wafer different from the first wafer, and then connecting the first chip C1 and the second chip C2 by a bonding method.

Specifically, the peripheral circuit 120 may be formed in the first chip C1, the memory call array 110 may be formed in the second chip C2, and the non-volatile memory device 100 may be implemented by bonding a bonding metal formed in the uppermost metal layer of the first chip C1 and a bonding metal formed in the uppermost metal layer of the chip C2. For example, in a case in which the memory cell array 110 is a three-dimensional memory cell array, a region in which the NAND strings and the bit lines BL are disposed may be defined as a bit line bonding region BLBA, a region in which the word lines WL are disposed may be defined as a word line bonding region WLBA, and a region in which the input/output pads PX and the dummy pad DPX are disposed may be defined as an external pad bonding region PA.

In an example embodiment, the dummy pad DPX and the dummy contact plug DCP may be formed in the external pad bonding region PA of the second chip C2. The dummy contact plug DCP may be formed to penetrate the external pad bonding region PA of the second chip C2. One end of the dummy contact plug DCP may be connected to the dummy pad DPX, and an opposite end of the dummy contact plug DCP may be connected to the bonding metal formed in the uppermost metal layer of the second chip C2. The dummy pad DPX and the dummy contact plug DCP may be used as the vertical capacitor VC or the vertical resistor VR in the external pad bonding region PA of the second chip C2, and thus a space of the external pad bonding region PA may be efficiently used without waste. In consequence, the non-volatile memory device 100 may provide a high-capacity capacitor or resistor in a state in which there is no increase in chip size or an increase in chip size is reduced or minimized.

Figure 4:
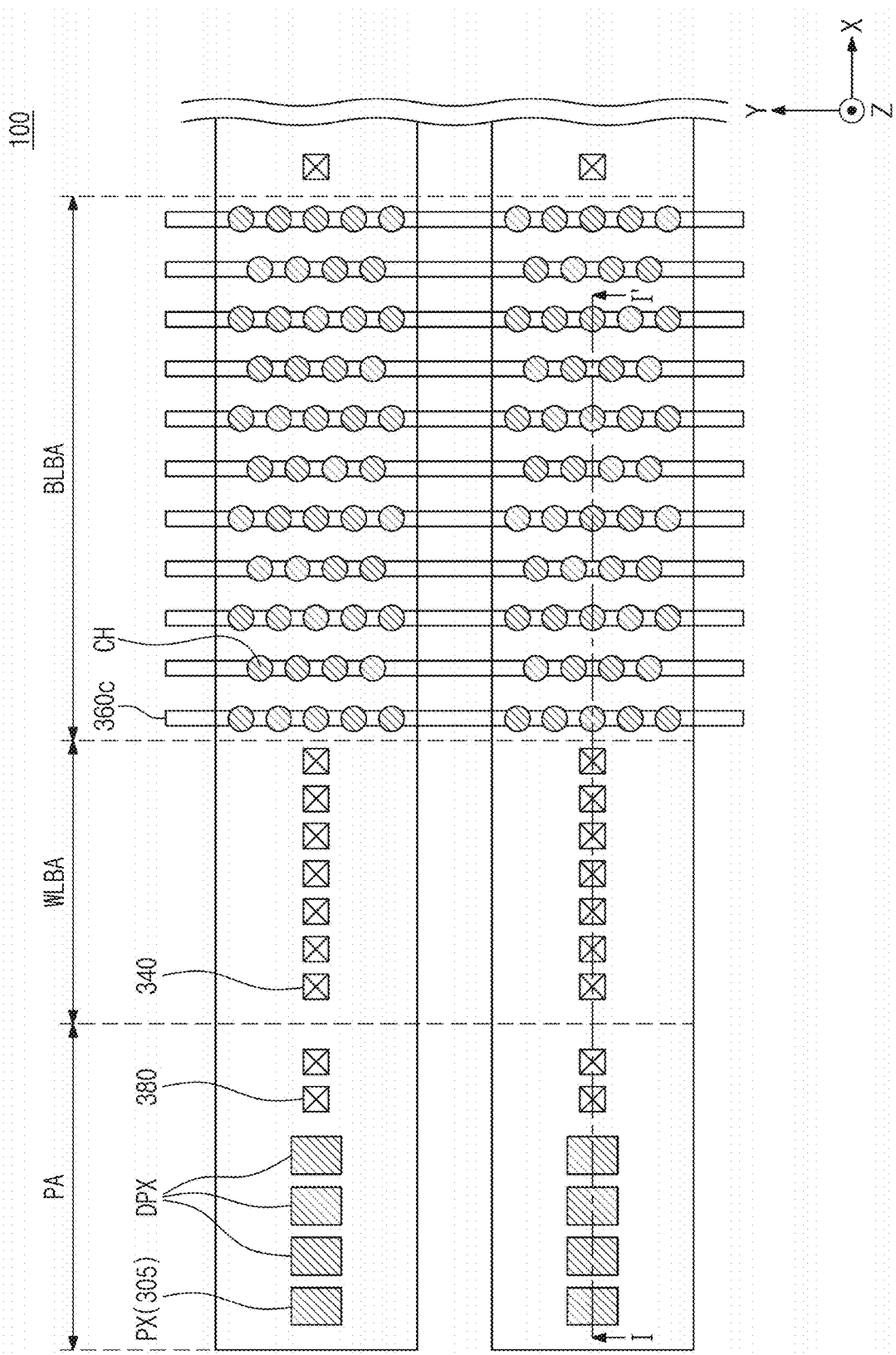
FIG. 4 is a plan view illustrating one example of the non-volatile memory device of FIG. 3.
Figure 5:
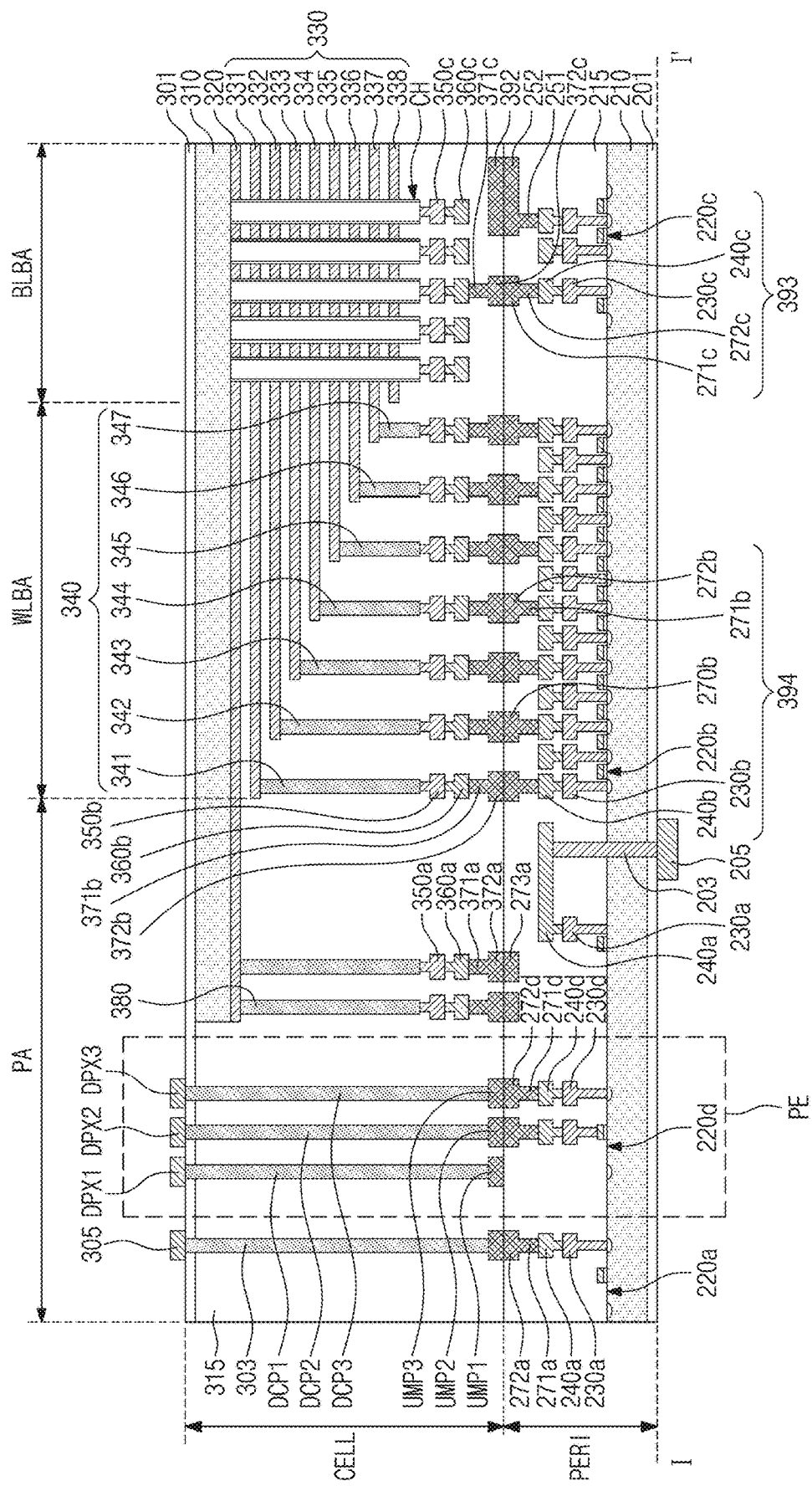
FIG. 5 is a sectional view taken along line I-I' of FIG. 4.

FIG. 4 is a plan view illustrating one example of the non-volatile memory device 100 of FIG. 3, and FIG. 5 is a sectional view taken along line I-I' of FIG. 4.

Referring to FIGS. 4 and 5, the non-volatile memory device 100 may be formed by manufacturing the first chip C1 including the peripheral circuit region PERI on the first wafer, manufacturing the second chip C2 including the cell region CELL on the second wafer, turning the second chip C2 over, and then bonding the turned-over second chip C2 to the first chip C1. For example, the bonding may be a method of electrically connecting the bonding metal formed in the uppermost metal layer of the first chip C1 and the bonding metal formed in the uppermost metal layer of the second chip C2. For example, in a case in which the bonding metals are formed of copper (Cu), the bonding may be a Cu-to-Cu bonding method. In another example embodiment, the bonding metals may be formed of aluminum (Al) or tungsten (W). In the following description, upper and lower directions are indicated based on before a first upper chip and a second upper chip are turned over. That is, an upper portion of a lower chip means a +Z-axis direction, and upper portions of the first and second upper chips mean a −Z-axis direction. However, this is illustrative, and only one of the first upper chip and the second upper chip may be turned over and may be connected by a bonding method.

Each of the peripheral circuit region PERI and the cell region CELL of the non-volatile memory device 100 may include the external pad bonding region PA, the word line bonding region WLBA, and the bit line bonding region BLBA.

The peripheral circuit region PERI may include a first substrate 210, an interlayer insulating layer 215, a plurality of circuit elements 220a, 220b, and 220c formed on the first substrate 210, first metal lines 230a, 230b, and 230c connected with the plurality of circuit elements 220a, 220b, and 220c, respectively, and second metal lines 240a, 240b, and 240c formed on the first metal lines 230a, 230b, and 230c. In an example embodiment, the first metal lines 230a, 230b, and 230c may be formed of tungsten having a relatively high electrical resistivity, and the second metal lines 240a, 240b, and 240c may be formed of copper having a relatively low electrical resistivity.

In this specification, only the first metal lines 230a, 230b, and 230c and the second metal lines 240a, 240b, and 240c are illustrated and described. However, without being limited thereto, one or more metal lines may be further formed on the second metal lines 240a, 240b, and 240c. In some example embodiments, the second metal lines 240a, 240b, and 240c may be formed of aluminum, and at least a part of the one or more metal lines formed on the second metal lines 240a, 240b, and 240c may be formed of copper having a lower electrical resistivity than the aluminum of the second metal lines 240a, 240b, and 240c.

The interlayer insulating layer 215 may be disposed on the first substrate 210 and may include an insulating material, such as silicon oxide or silicon nitride.

Upper bonding metals 271b and 272b may be formed on the second metal line 240b of the word line boding region WLBA. In the word line bonding region WLBA, the upper bonding metals 271b and 272b of the peripheral circuit region PERI may be electrically connected with upper bonding metals 371b and 372b of the cell region CELL by a bonding method. The upper bonding metals 271b and 272b and the upper bonding metals 371b and 372b may be formed of aluminum, copper, or tungsten, but example embodiments are not limited thereto. A second metal lines 240d may be formed on a first metal lines 230d, an upper bonding metal 271a may be formed on the second metal line 240a, and an upper bonding metal 271d may be formed on the second metal line 240d.

The cell region CELL may include at least one memory block. The cell region CELL may include a second substrate 310 and a common source line 320. A plurality of word lines 330 (e.g., 331, 332, 333, 334, 335, 336, 337 and 338) may be stacked on the second substrate 310 in a direction (e.g., the Z-axis direction) perpendicular or substantially perpendicular to a top surface of the second substrate 310. String selection lines and a ground selection line may be disposed on and under the word lines 330, and the plurality of word lines 330 may be disposed between the string selection lines and the ground selection line.

In the bit line bonding region BLBA, a channel structure CH may extend in the direction (e.g., the Z-axis direction) perpendicular or substantially perpendicular to the top surface of the second substrate 310 and may penetrate the word lines 330, the string selection lines, and the ground selection line. The channel structure CH may include a data storage layer, a channel layer, and a buried insulating layer, and the channel layer may be electrically connected with a first metal line 350c and a second metal line 360c. For example, the second metal line 360c may be a bit line and may be connected to the channel structure CH through the first metal line 350c. In an example embodiment, the bit line 360c may extend in a first direction (e.g., a Y-axis direction) parallel or substantially parallel to the top surface of the second substrate 310.

In the example embodiment illustrated in FIGS. 4 and 5, the region in which the channel structure CH and the bit line 360c are disposed may be defined as the bit line bonding region BLBA. In the bit line bonding region BLBA, the bit line 360c may be electrically connected with the circuit elements 220c that provide a page buffer 393 in the peripheral circuit region PERI. For example, the bit line 360c may be connected with upper bonding metals 371c and 372c, and the upper bonding metals 371c and 372c may be connected with upper bonding metals 271c and 272c connected to the circuit elements 220c of the page buffer 393. The In the word line bonding region WLBA, the word lines 330 may extend in a second direction (e.g., an X-axis direction) perpendicular or substantially perpendicular to the first direction and parallel or substantially parallel to the top surface of the second substrate 310 and may be connected with a plurality of cell contact plugs 340 (e.g., 341, 342, 343, 344, 345, 346 and 347). The word lines 330 and the cell contact plugs 340 may be connected with each other at pads that portions of the word lines 330 extend different lengths in the second direction to provide. A first metal line 350b and a second metal line 360b may be sequentially connected to upper portions of the cell contact plugs 340 connected to the word lines 330. In the word line bonding region WLBA, the cell contact plugs 340 may be connected with the peripheral circuit region PERI through the upper bonding metals 371b and 372b of the cell region CELL and the upper bonding metals 271b and 272b of the peripheral circuit region PERI.

The cell contact plugs 340 may be electrically connected with the circuit elements 220b that form a row decoder 394 in the peripheral circuit region PERI. In an example embodiment, an operating voltage of the circuit elements 220b that form the row decoder 394 may differ from an operating voltage of the circuit elements 220c that form the page buffer 393. For example, the operating voltage of the circuit elements 220c that form the page buffer 393 may be greater than the operating voltage of the circuit elements 220b that form the row decoder 394.

A common source line contact plug 380 may be disposed in the external pad bonding region PA. The common source line contact plug 380 may be formed of a conductive material, such as a metal, a metal compound, or doped poly-silicon, and may be electrically connected with the common source line 320. A first metal line 350a and a second metal line 360a may be sequentially stacked on an upper portion of the common source line contact plug 380. For example, the region in which the common source line contact plug 380, the first metal line 350a, and the second metal line 360a are disposed may be defined as the external pad bonding region PA.

Input/output pads 205 and 305 may be disposed in the external pad bonding region PA. A lower insulating layer 201 may be formed under the first substrate 210 to cover a bottom surface of the first substrate 210, and the first input/output pad 205 may be formed on the lower insulating layer 201. The first input/output pad 205 may be connected with at least one of the plurality of circuit elements 220a, 220b, and 220c disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 and may electrically isolate the first input/output contact plug 203 from the first substrate 210.

An upper insulating layer 301 may be formed on the second substrate 310 to cover the top surface of the second substrate 310, and the second input/output pad 305 may be formed on the upper insulating layer 301. The second input/output pad 305 may be connected with at least one of the plurality of circuit elements 220a, 220b, and 220c disposed in the peripheral circuit region PERI through a second input/output contact plug 303. For example, the second input/output pad 305 may be electrically connected with the circuit element 220a.

In some example embodiments, the first input/output pad 205 and the second input/output pad 305 may be selectively formed. For example, the non-volatile memory device 100 may include only the first input/output pad 205 disposed on the first substrate 210, or may include only the second input/output pad 305 disposed on the second substrate 310. Alternatively, the non-volatile memory device 100 may include both the first input/output pad 205 and the second input/output pad 305.

Referring continuously to FIGS. 4 and 5, in each of the external pad bonding regions PA and the bit line bonding regions BLBA included in the cell region CELL and the peripheral circuit region PERI, a metal pattern of the uppermost metal layer may exist as a dummy pattern, or the uppermost metal layer may be empty.

In the external pad bonding region PA of the non-volatile memory device 100, an upper metal pattern 273a having the same or substantially the same shape as an upper metal pattern 372a of the cell region CELL may be formed in the uppermost metal layer of the peripheral circuit region PERI to correspond to the upper metal pattern 372a formed in the uppermost metal layer of the cell region CELL. The upper metal pattern 273a formed in the uppermost metal layer of the peripheral circuit region PERI may not be connected with a separate contact in the peripheral circuit region PERI.

The upper bonding metals 271b and 272b may be formed on the second metal line 240b of the word line boding region WLBA. In the word line bonding region WLBA, the upper bonding metals 271b and 272b of the peripheral circuit region PERI may be electrically connected with the upper bonding metals 371b and 372b of the cell region CELL by a bonding method.

Furthermore, in the bit line bonding region BLBA, an upper metal pattern 392 having the same or substantially the same shape as an upper metal pattern 252 of the peripheral circuit region PERI may be formed in the uppermost metal layer of the cell region CELL to correspond to the upper metal pattern 252 formed on the uppermost metal line of the peripheral circuit region PERI. The upper metal pattern 252 may include an upper bonding metal 251. A contact may not be formed on the upper metal pattern 392 formed in the uppermost metal layer of the cell region CELL.

In an example embodiment, dummy pads DPX1, DPX2, and DPX3 may be additionally disposed on the upper insulating layer 301. The dummy pads DPX1, DPX2, and DPX3 may be arranged in the second direction (e.g., the X-axis direction) perpendicular or substantially perpendicular to the first direction and parallel or substantially parallel to the top surface of the second substrate 310. For example, the dummy pads DPX1, DPX2, and DPX3 may be disposed on one side of the second input/output pad 305 in the second direction (e.g., the X-axis direction) on the upper insulating layer 301. The dummy pads DPX1, DPX2, and DPX3 may be connected with at least one of the plurality of circuit elements 220a, 220b, 220c, and 220d disposed in the peripheral circuit region PERI through dummy contact plugs DCP1, DCP2, and DCP3. In an example embodiment, the dummy contact plugs DCP1, DCP2, and DCP3 may be electrically connected with the circuit element 220d.

The dummy contact plugs DCP1, DCP2, and DCP3 may be formed of a conductive material, such as a metal, a metal compound, or doped poly-silicon, and may be electrically connected to respective upper metal patterns UMP1, UMP2, and UMP3 formed in the uppermost metal layer of the cell region CELL. Upper metal patterns 272d having the same shape as the upper metal patterns UMP1, UMP2, and UMP3 of the cell region CELL may be formed in the uppermost metal layer of the peripheral circuit region PERI to correspond to the upper metal patterns UMP1, UMP2, and UMP3. The upper metal patterns UMP1, UMP2, and UMP3 of the cell region CELL and the upper metal patterns 272d of the peripheral circuit region PERI may be electrically connected with each other by a bonding method.

The second substrate 310 and the common source line 320 may not be disposed in the region in which the dummy contact plugs DCP1, DCP2, and DCP3 are disposed. In addition, the dummy pads DPX1, DPX2, and DPX3 may not overlap the word lines 330 in a third direction (e.g., the Z-axis direction). Referring to FIG. 5, the dummy contact plugs DCP1, DCP2, and DCP3 may be separated from the second substrate 310 in the direction parallel to the top surface of the second substrate 310. The dummy contact plugs DCP1, DCP2, and DCP3 may penetrate an interlayer insulating layer 315 of the cell region CELL and may be connected to the dummy pads DPX1, DPX2, and DPX3, respectively.

In an example embodiment according to the spirit and scope of the present disclosure, the dummy pads DPX1, DPX2, and DPX3 and the dummy contact plugs DCP1, DCP2, and DCP3 may constitute a passive element PE, such as a capacitor or a resistor, or may be implemented as a portion thereof.

For example, in some example embodiments in which the dummy pads DPX1, DPX2, and DPX3 and the dummy contact plugs DCP1, DCP2, and DCP3 are implemented as a capacitor, the dummy contact plugs DCP1, DCP2, and DCP3 may be electrically isolated from each other and may be used as electrodes of the capacitor. Since the dummy contact plugs DCP1, DCP2, and DCP3 are formed to extend in the third direction (e.g., the Z-axis direction) perpendicular or substantially perpendicular to the second substrate 310, the capacitor formed by using the dummy contact plugs DCP1, DCP2, and DCP3 may be referred to as the vertical capacitor VC.

In another example embodiment in which the dummy pads DPX1, DPX2, and DPX3 and the dummy contact plugs DCP1, DCP2, and DCP3 form a resistor, the dummy pads DPX1, DPX2, and DPX3 and the dummy contact plugs DCP1, DCP2, and DCP3 may be electrically connected with each other. Since the dummy contact plugs DCP1, DCP2, and DCP3 are formed to extend in the third direction (e.g., the Z-axis direction) perpendicular or substantially perpendicular to the second substrate 310, the resistor formed by using the dummy contact plugs DCP1, DCP2, and DCP3 may be referred to as the vertical resistor VR.

In some example embodiments, the vertical capacitor VC and the vertical resistor VR may be selectively formed. For example, the non-volatile memory device 100 may include only the vertical capacitor VC in the external pad bonding region PA, or may include only the vertical resistor VR in the external pad bonding region PA. Alternatively, the non-volatile memory device 100 may include both the vertical capacitor VC and the vertical resistor VR.

As described above, the non-volatile memory device 100 according to some example embodiments of the inventive concepts may include the dummy contact plugs DCP1, DCP2, and DCP3 that penetrate the interlayer insulating layer 315 of the cell region CELL in the external pad bonding region PA and electrically connect the dummy pads DPX1, DPX2, and DPX3 and the peripheral circuit region PERI and may use the dummy contact plugs DCP1, DCP2, and DCP3 and the dummy pads DPX1, DPX2, and DPX3 connected thereto as the vertical capacitor VC or the vertical resistor VR. Accordingly, the space of the external pad bonding region PA may be efficiently used without waste.

Meanwhile, the vertical capacitor VC and the vertical resistor VR may be implemented in various forms. Hereinafter, some example embodiments of the vertical capacitor VC and the vertical resistor VR will be described in more detail.

Figure 6:
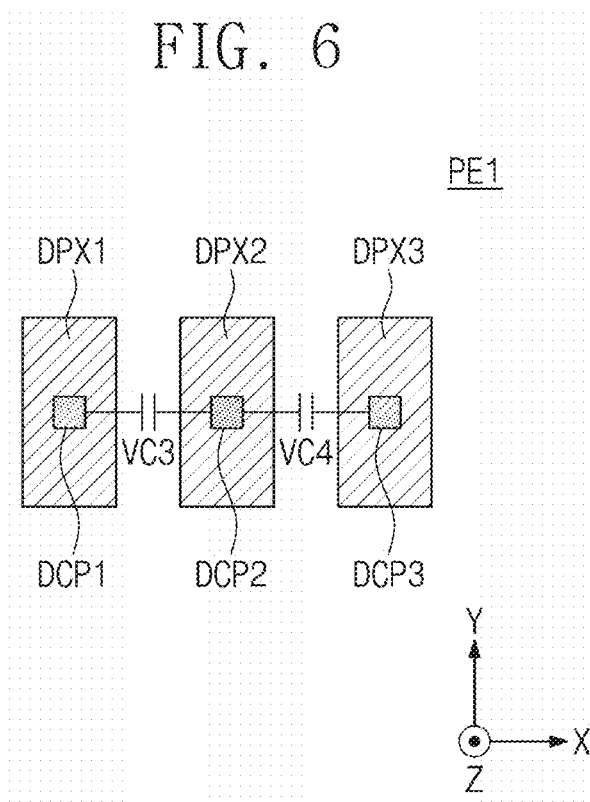
FIGS. 6 and 7 are views illustrating an example of a vertical capacitor structure formed by a dummy pad DPX and a dummy contact plug DCP according to an example embodiment of the inventive concepts.
Figure 7:
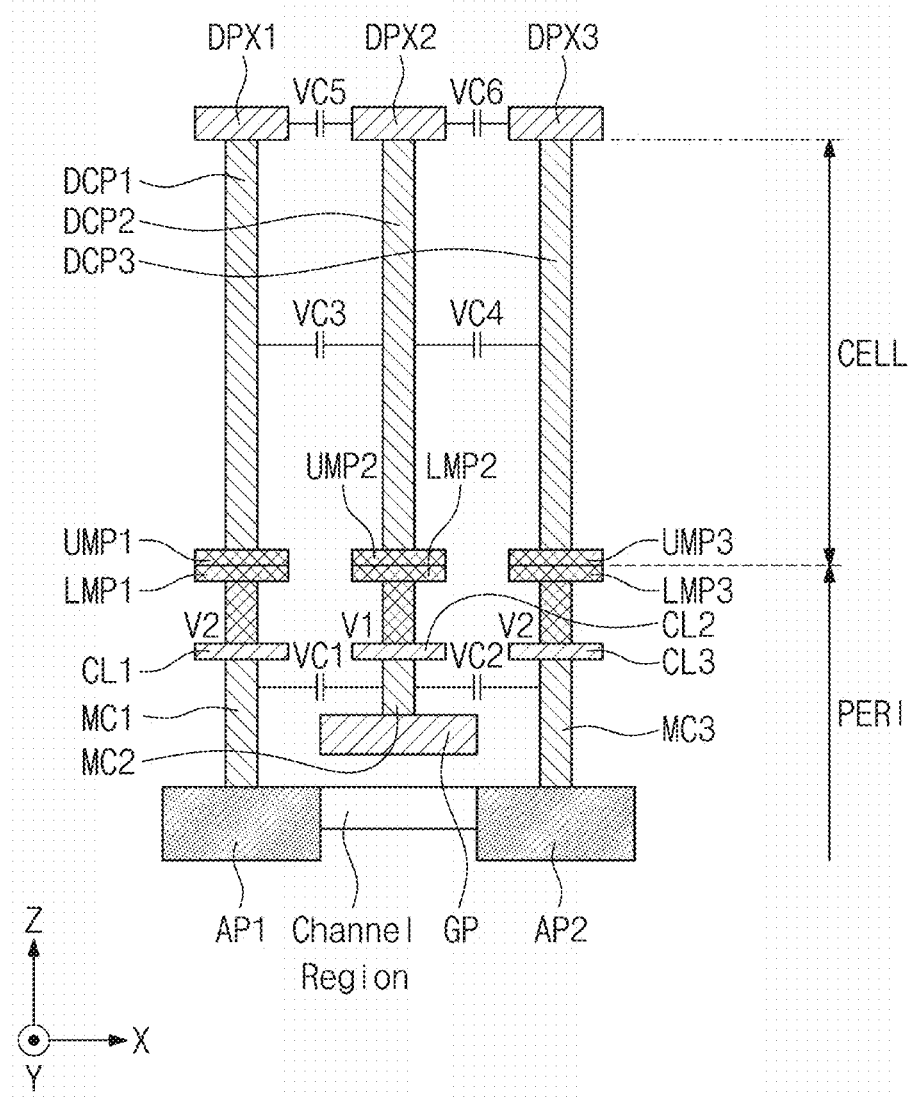

FIGS. 6 and 7 are views illustrating one example of a vertical capacitor structure formed by a dummy pad DPX and a dummy contact plug DCP according to an example embodiment of the inventive concepts. FIG. 6 is a plan view of the vertical capacitor structure, and FIG. 7 is a sectional view of the vertical capacitor structure.

Referring to FIGS. 6 and 7, first and second active patterns AP1 and AP2 may be defined in a peripheral circuit region PERI, and a channel region may be defined between the first and second active patterns AP1 and AP2. First to third capacitor electrodes MC1, MC2, and MC3 may be disposed on the first active pattern AN, a gate pattern GP, and the second active pattern AP2, respectively, and first to third conductive lines CL1, CL2, and CL3 may be disposed on the first to third capacitor electrodes MC1, MC2, and MC3, respectively.

In FIGS. 6 and 7, only the first to third conductive lines CL1, CL2, and CL3 formed in one metal layer are illustrated and described. However, without being limited thereto, one or more metal layers may be further formed on the metal layer in which the first to third conductive lines CL1, CL2, and CL3 are formed.

Lower metal patterns LMP1, LMP2, and LMP3 having the same or substantially the same shape as upper metal patterns UMP1, UMP2, and UMP3 of a cell region CELL may be formed in the uppermost metal layer of the peripheral circuit region PERI. The first to third lower metal patterns LMP1, LMP2, and LMP3 may be electrically connected to the first to third conductive lines CL1, CL2, and CL3 through contacts.

Dummy pads DPX1, DPX2, and DPX3 may be spaced apart from each other in the second direction (e.g., the X-axis direction). In the cell region CELL, dummy contact plugs DCP1, DCP2, and DCP3 may be disposed to correspond to the dummy pads DPX1, DPX2, and DPX3 and may extend in the third direction (e.g., the Z-axis direction) perpendicular or substantially perpendicular to the second direction. Referring to FIG. 6, one dummy contact plug may be disposed to correspond to only one dummy pad.

The dummy contact plugs DCP1, DCP2, and DCP3 may be electrically connected to the respective upper metal patterns UMP1, UMP2, and UMP3 formed in the uppermost metal layer. The upper metal patterns UMP1, UMP2, and UMP3 of the cell region CELL may be formed in the same or substantially the same shape as the lower metal patterns LMP1, LMP2, and LMP3 of the peripheral circuit region PERI, and the upper metal patterns UMP1, UMP2, and UMP3 of the cell region CELL and the lower metal patterns LMP1, LMP2, and LMP3 of the peripheral circuit region PERI may be electrically connected with each other by a bonding method. Accordingly, the first to third dummy contact plugs DCP1, DCP2, and DCP3 may be electrically connected to the first to third capacitor electrodes MC1, MC2, and MC3, respectively.

In an example embodiment, a second voltage V2 may be applied to the first and third conductive lines CL1 and CL3 of the peripheral circuit region PERI, and a first voltage V1 different from the second voltage V2 may be applied to the second conductive line CL2. Accordingly, the first voltage V1 may be applied to the gate pattern GP, and the second voltage V2 may be applied to the first and second active patterns AP1 and AP2. Since the same or substantially the same voltage (e.g., the second voltage V2) is applied to the first and second active patterns AP1 and AP2 as described above, a turn-on current may not flow in the channel region, and charges of the channel region may be in a trapped state. Accordingly, the gate pattern GP and the first and second active patterns AP1 and AP2 may not constitute a MOS transistor.

In an example embodiment, the first capacitor electrode MC1 and the second capacitor electrode MC2 of the peripheral circuit region PERI may constitute a first vertical capacitor VC1, and the second capacitor electrode MC2 and the third capacitor electrode MC3 may constitute a second vertical capacitor VC2. In addition, the first dummy contact plug DCP1 and the second dummy contact plug DCP2 of the cell region CELL may constitute a third vertical capacitor VC3, and the second dummy contact plug DCP2 and the third dummy contact plug DCP3 may constitute a fourth vertical capacitor VC4. The first dummy pad DPX1 and the second dummy pad DPX2 may constitute a fifth vertical capacitor VC5, and the second dummy pad DPX2 and the third dummy pad DPX3 may constitute a sixth vertical capacitor VC6.

As described above, the vertical capacitor structure PE1 according to some example embodiments may implement the first to sixth vertical capacitors VC1 to VC6 and thus may increase capacitance per unit area. In particular, the vertical capacitor structure PE1 according to some example embodiments may further obtain the third to sixth vertical capacitors VC3 to VC6 by arranging the dummy contact plugs DCP1, DCP2, and DCP3 in the cell region CELL and connecting the dummy contact plugs DCP1, DCP2, and DCP3 to the capacitor electrodes MC1, MC2, and MC3 of the peripheral circuit region PERI. Accordingly, the capacitance of the vertical capacitor structure PE1 may increase.

Figure 8:
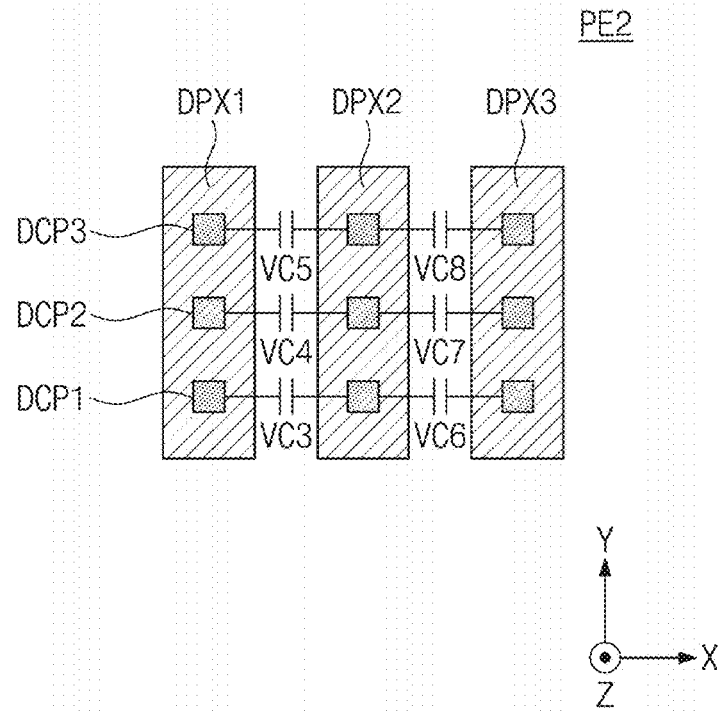
FIGS. 8 and 9 are plan views illustrating vertical capacitor structures according to other example embodiments of the inventive concepts.
Figure 9:
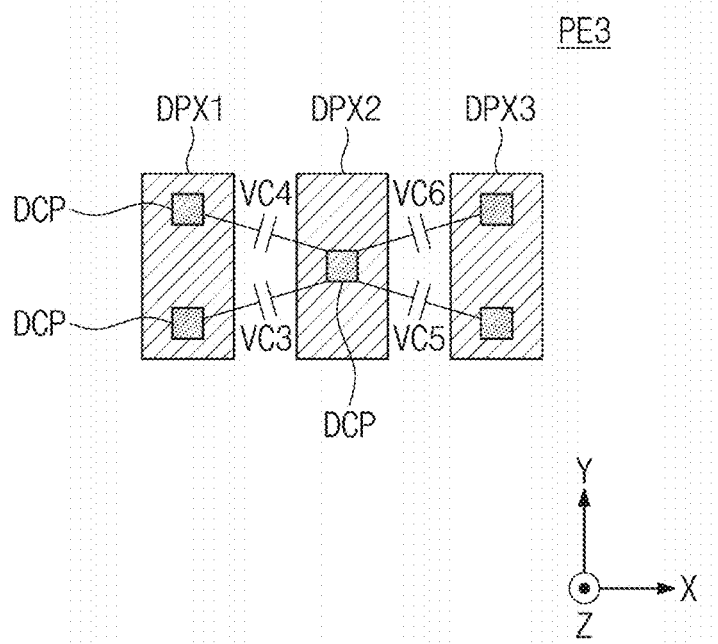

FIGS. 8 and 9 are plan views illustrating vertical capacitor structures according to other example embodiments of the inventive concepts. The vertical capacitor structures PE2 and PE3 illustrated in FIGS. 8 and 9 are similar to the vertical capacitor structure PE1 illustrated in FIGS. 6 and 7. Accordingly, identical or similar components will be assigned with identical or similar reference numerals, and repetitive descriptions will hereinafter be omitted for the sake of brevity.

Referring to FIG. 8, dummy pads DPX1, DPX2, and DPX3 may extend in the first direction (e.g., the Y-axis direction) and may be arranged to be spaced apart from each other in the second direction (e.g., the X-axis direction). In a cell region CELL, dummy contact plugs DCP1, DCP2, and DCP3 may be disposed to correspond to the dummy pads DPX1, DPX2, and DPX3 and may extend in the third direction (e.g., the Z-axis direction) perpendicular or substantially perpendicular to the second direction.

In the vertical capacitor structure PE1 of FIG. 6, one dummy contact plug is disposed to correspond to one dummy pad, whereas in the vertical capacitor structure PE2 of FIG. 8, a plurality of dummy contact plugs may be disposed to correspond to one dummy pad. For example, three dummy contact plugs may be disposed to correspond to each of the first to third dummy pads DPX1, DPX2, and DPX3.

In some example embodiments, the three dummy contact plugs connected to the first dummy pad DPX1 and the three dummy contact plugs connected to the second dummy pad DPX2 may constitute third to fifth vertical capacitors VC3, VC4, and VC5, and the three dummy contact plugs connected to the second dummy pad DPX2 and the three dummy contact plugs connected to the third dummy pad DPX3 may constitute sixth to eighth vertical capacitors VC6, VC7, and VC8. Accordingly, the capacitance of the vertical capacitor structure PE2 may further increase.

Referring to FIG. 9, the vertical capacitor structure PE3 may include dummy pads DPX1, DPX2, and DPX3 that extend in the first direction (e.g., the Y-axis direction) and that are spaced apart from each other in the second direction (e.g., the X-axis direction), and the number of dummy contact plugs corresponding to each of the dummy pads DPX1, DPX2, and DPX3 may not be the same. For example, two dummy contact plugs may be disposed to correspond to the first dummy pad DPX1, one dummy contact plug may be disposed to correspond to the second dummy pad DPX2, and two dummy contact plugs may be disposed to correspond to the third dummy pad DPX3.

In some example embodiments, the two dummy contact plugs connected to the first dummy pad DPX1 and the one dummy contact plug connected to the second dummy pad DPX2 may constitute third and fourth vertical capacitors VC3 and VC4, and the one dummy contact plug connected to the second dummy pad DPX2 and the two dummy contact plugs connected to the third dummy pad DPX3 may constitute fifth and sixth vertical capacitors VC5 and VC6. Accordingly, the capacitance of the vertical capacitor structure PE2 may increase.

Figure 10:
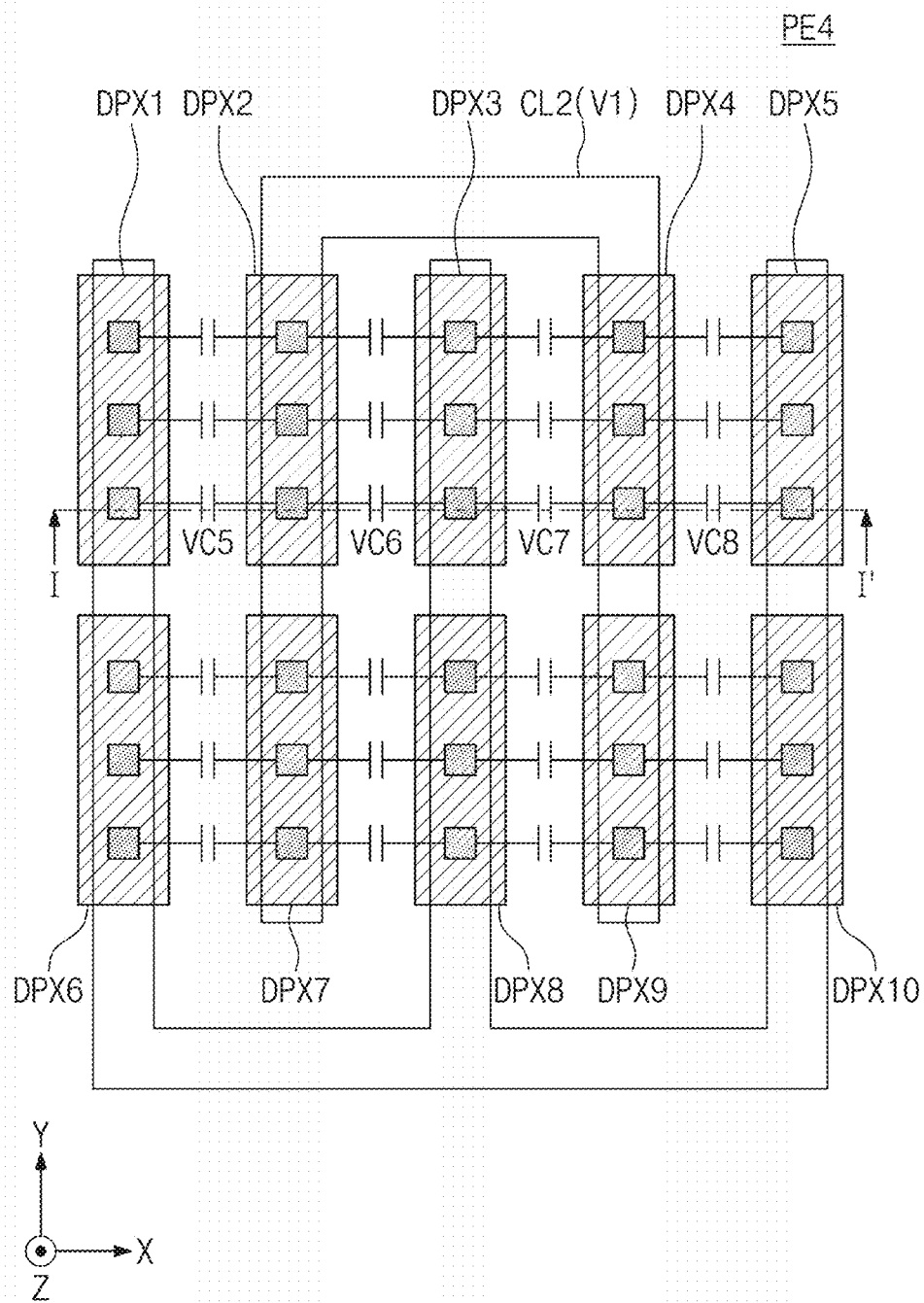
FIGS. 10 and 11 are views illustrating a vertical capacitor structure according to another example embodiment of the inventive concepts.
Figure 11:
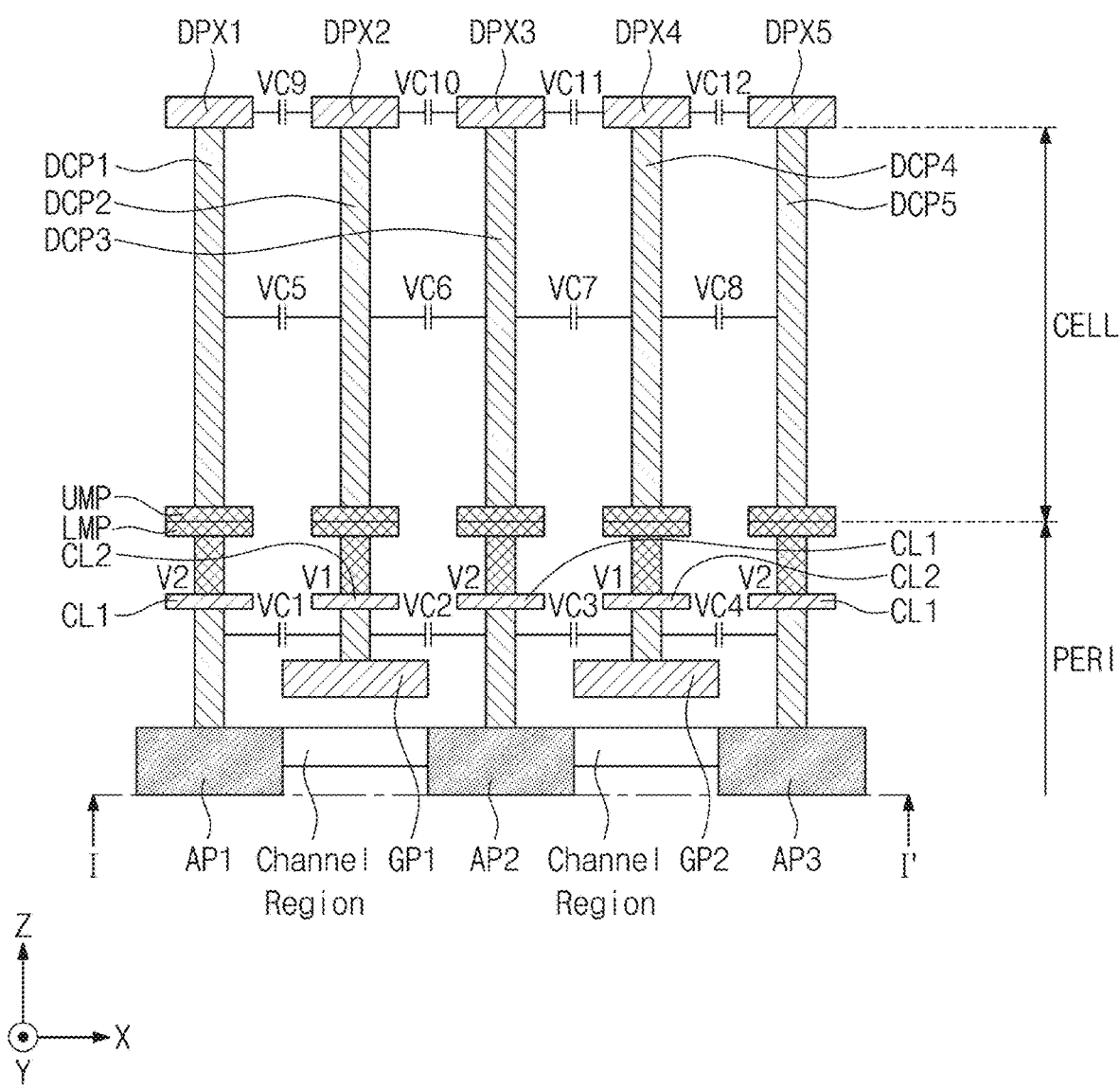

FIGS. 10 and 11 are views illustrating a vertical capacitor structure according to another example embodiment of the present disclosure. FIG. 10 is a plan view of the vertical capacitor structure, and FIG. 11 is a sectional view taken along line I-I' of FIG. 10. The vertical capacitor structures PE4 illustrated in FIGS. 10 and 11 is similar to the vertical capacitor structure PE1 illustrated in FIGS. 6 and 7. Accordingly, identical or similar components will be assigned with identical or similar reference numerals, and repetitive descriptions will hereinafter be omitted for the sake of brevity.

Referring to FIGS. 10 and 11, a plurality of dummy pads DPX1, DPX2, DPX3, DPX4, DPX5, DPX6, DPX7, DPX8, DPX9 and DPX10 may be arranged to be spaced apart from each other in the first direction (e.g., the Y-axis direction) and the second direction (e.g., the X-axis direction). At least one dummy contact plug may be disposed to correspond to each of the plurality of dummy pads DPX1 to DPX10. For example, three dummy contact plugs may be disposed to correspond to each of the plurality of dummy pads DPX1 to DPX10.

In a cell region CELL, dummy contact plugs adjacent to each other and electrically isolated from each other may constitute a vertical capacitor. For example, referring to FIG. 11, a first dummy contact plug DCP1 connected to the first dummy pad DPX1 and a second dummy contact plug DCP2 connected to the second dummy pad DPX2 may constitute a fifth vertical capacitor VC5. In addition, the second dummy contact plug DCP2 connected to the second dummy pad DPX2 and a third dummy contact plug DCP3 connected to the third dummy pad DPX3 may constitute a sixth vertical capacitor VC6, the third dummy contact plug DCP3 connected to the third dummy pad DPX3 and a fourth dummy contact plug DCP4 connected to the fourth dummy pad DPX4 may constitute a seventh vertical capacitor VC7, and the fourth dummy contact plug DCP4 connected to the fourth dummy pad DPX4 and a fifth dummy contact plug DCP5 connected to the fifth dummy pad DPX5 may constitute an eighth vertical capacitor VC8. The vertical capacitor structure of FIG. 11 includes a ninth vertical capacitor VC9, a tenth vertical capacitor VC10, an eleventh vertical capacitor VC11, and a twelfth vertical capacitor VC12.

In a peripheral circuit region PERI, each of conductive lines CL1 and CL2 may be provided to electrically connect electrodes of vertical capacitors in a horizontal direction. For example, the first conductive line CL1 may extend in the first direction (e.g., the Y-axis direction) and may electrically connect dummy pads and dummy contact plugs disposed in the first direction (e.g., the Y-axis direction). The second conductive line CL2 may be spaced apart from the first conductive line CL1 in the horizontal direction and may electrically connect dummy pads and dummy contact plugs disposed in the first direction (e.g., the Y-axis direction). In some example embodiments, since the first conductive line CL1 and the second conductive line CL2 are spaced apart from each other, the dummy pads and the dummy contact plugs electrically connected to the first conductive line CL1 may be electrically isolated from the dummy pads and the dummy contact plugs electrically connected to the second conductive line CL2.

For example, referring to FIGS. 10 and 11, the first conductive line CL1 may extend in the first direction (e.g., the Y-axis direction) and may electrically connect the first and sixth dummy pads DPX1 and DPX6 and the dummy contact plugs connected thereto. The second conductive line CL2 may extend in the first direction (e.g., the Y-axis direction) and may electrically connect the second and seventh dummy pads DPX2 and DPX7 and the dummy contact plugs connected thereto. Since the first conductive line CL1 and the second conductive line CL2 are spaced apart from each other in the horizontal direction, the dummy pads and the dummy contact plugs electrically connected to the first conductive line CL1 may be electrically isolated from the dummy pads and the dummy contact plugs electrically connected to the second conductive line CL2.

In the peripheral circuit region PERI, a second voltage V2 may be applied to the first conductive line CL1, and a first voltage V1 different from the second voltage V2 may be applied to the second conductive line CL2. Accordingly, the first voltage V1 may be applied to first and second gate patterns GP1 and GP2, and the second voltage V2 may be applied to first to third active patterns AP1 to AP3. Since the same or substantially the same voltage (e.g., the second voltage V2) is applied to the first to third active patterns AP1 to AP3 as described above, a turn-on current may not flow in channel regions. Accordingly, the gate patterns GP1 and GP2 and the first to third active patterns AP1 to AP3 may not constitute a MOS transistor, and the vertical capacitor structure PE4 according to this example embodiment may operate as a capacitor.

As described above, the vertical capacitor structure PE4 according to some example embodiments may provide the first and second conductive lines CL1 and CL2 spaced apart from each other in the horizontal direction, the first conductive line CL1 may electrically connect first electrodes of the vertical capacitors, and the second conductive line CL2 may electrically connect second electrodes of the vertical capacitors. Accordingly, the vertical capacitor structure PE4 according to this embodiment may provide a high-capacity capacitor.

Meanwhile, in the above description, it has been described that the first electrodes of the vertical capacitors are electrically connected by the first conductive line CL1 and the second electrodes of the vertical capacitors are electrically connected by the second conductive line CL2 spaced apart from the first conductive line CL1 in the horizontal direction. However, this is illustrative, and the inventive concepts are not limited thereto. For example, a high-capacity capacitor may be constituted by using an upper metal pattern UMP and/or a lower metal pattern LMP instead of the first and second conductive lines CL1 and CL2. For example, when viewed in the horizontal direction, a first upper metal pattern may be formed in the same shape as the first conductive line CL1 of FIG. 10, and a second upper metal pattern may be formed in the same shape as the second conductive line CL2 of FIG. 10. That is, the first upper metal pattern and the second upper metal pattern may be formed to be electrically isolated from each other when viewed in the horizontal direction, the first electrodes of the vertical capacitors may be connected by the first upper metal pattern, and the second electrodes of the vertical capacitors may be connected by the second upper metal pattern. As described above, a high-capacity capacitor may be provided by using only the metal lines disposed in the cell region CELL.

Figure 12:
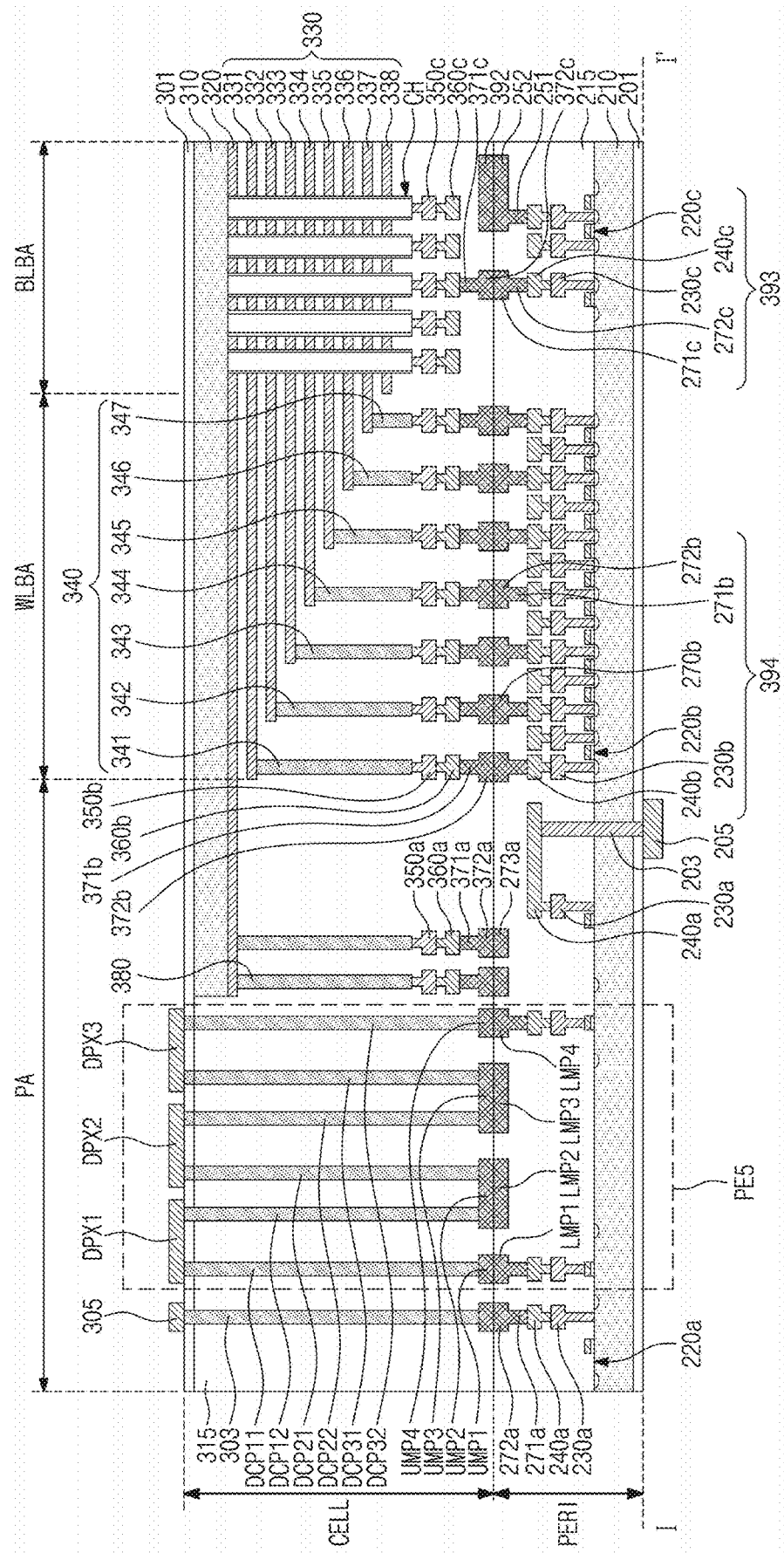
FIG. 12 is a view illustrating one example of a vertical resistor structure formed by a dummy pad DPX and a dummy contact plug DCP according to an example embodiment of the inventive concepts.

FIG. 12 is a view illustrating an example of a vertical resistor structure formed by a dummy pad DPX and a dummy contact plug DCP according to an example embodiment of the inventive concepts. FIG. 12 is a view illustrating an example of a section corresponding to line I-I' of FIG. 4. A non-volatile memory device of FIG. 12 is similar to the non-volatile memory device of FIG. 5. Accordingly, identical or similar components will be assigned with identical or similar reference numerals, and repetitive descriptions will hereinafter be omitted.

Referring to FIG. 12, dummy pads DPX1, DPX2, and DPX3 and dummy contact plugs DCP11, DCP12, DCP21, DCP22, DCP31, and DCP32 may be electrically integrally connected to generate resistance. To provide higher resistance by forming a longer electrical connection path, the dummy pads DPX1, DPX2, and DPX3 and the dummy contact plugs DCP11, DCP12, DCP21, DCP22, DCP31, and DCP32 may be formed in a zigzag pattern in the third direction (e.g., the Z-axis direction) perpendicular or substantially perpendicular to a substrate.

In more detail, the dummy pads DPX1, DPX2, and DPX3 may be disposed on an upper insulating layer 301. The dummy pads DPX1, DPX2, and DPX3 may be arranged in the second direction (e.g., the X-axis direction) parallel or substantially parallel to a top surface of a second substrate 310. For example, the dummy pads DPX1, DPX2, and DPX3 may be disposed on one side of a second input/output pad 305 in the second direction (e.g., the X-axis direction) on the upper insulating layer 301.

A plurality of dummy contact plugs may be provided in a cell region CELL. One end of each of the dummy contact plugs may be electrically connected to an upper metal pattern formed in the uppermost metal layer of the cell region CELL, and an opposite end of the dummy contact plug may be electrically connected to a corresponding dummy pad.

Accordingly, the dummy pads, the dummy contact plugs, and the upper metal patterns may be electrically connected to form one resistor and may form a zigzag pattern in the third direction (e.g., the Z-axis direction) to provide higher resistance.

As described above, the non-volatile memory device 100 according to some example embodiments may implement the vertical resistor structure using the dummy pads and the dummy contact plugs provided in the external pad bonding region PA. Hereinafter, some example embodiments of a vertical resistor structure will be described in more detail.

Figure 13:
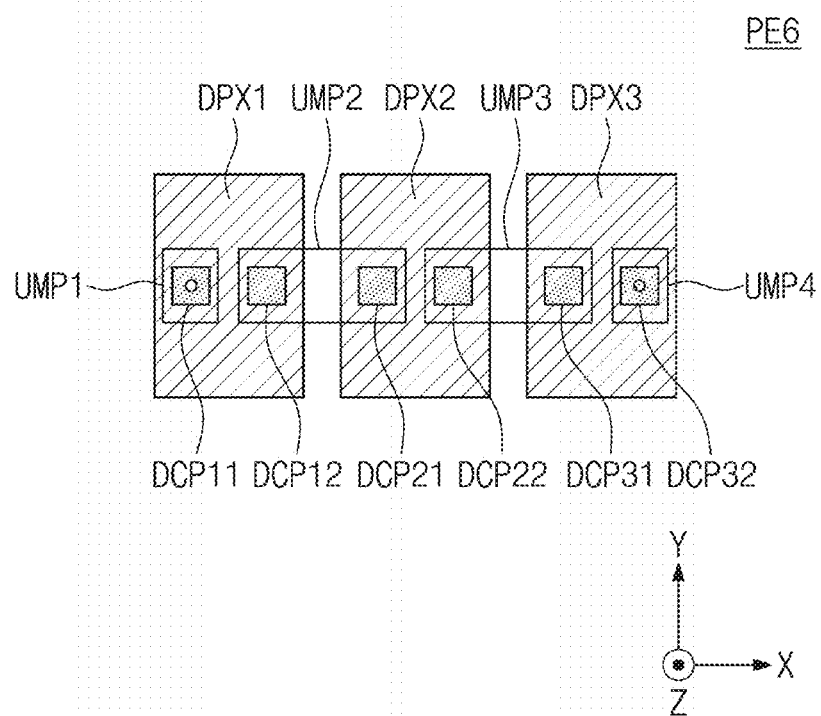
FIGS. 13 and 14 are views illustrating an example of a vertical resistor structure formed by a dummy pad DPX and a dummy contact plug DCP according to an example embodiment of the inventive concepts.
Figure 14:
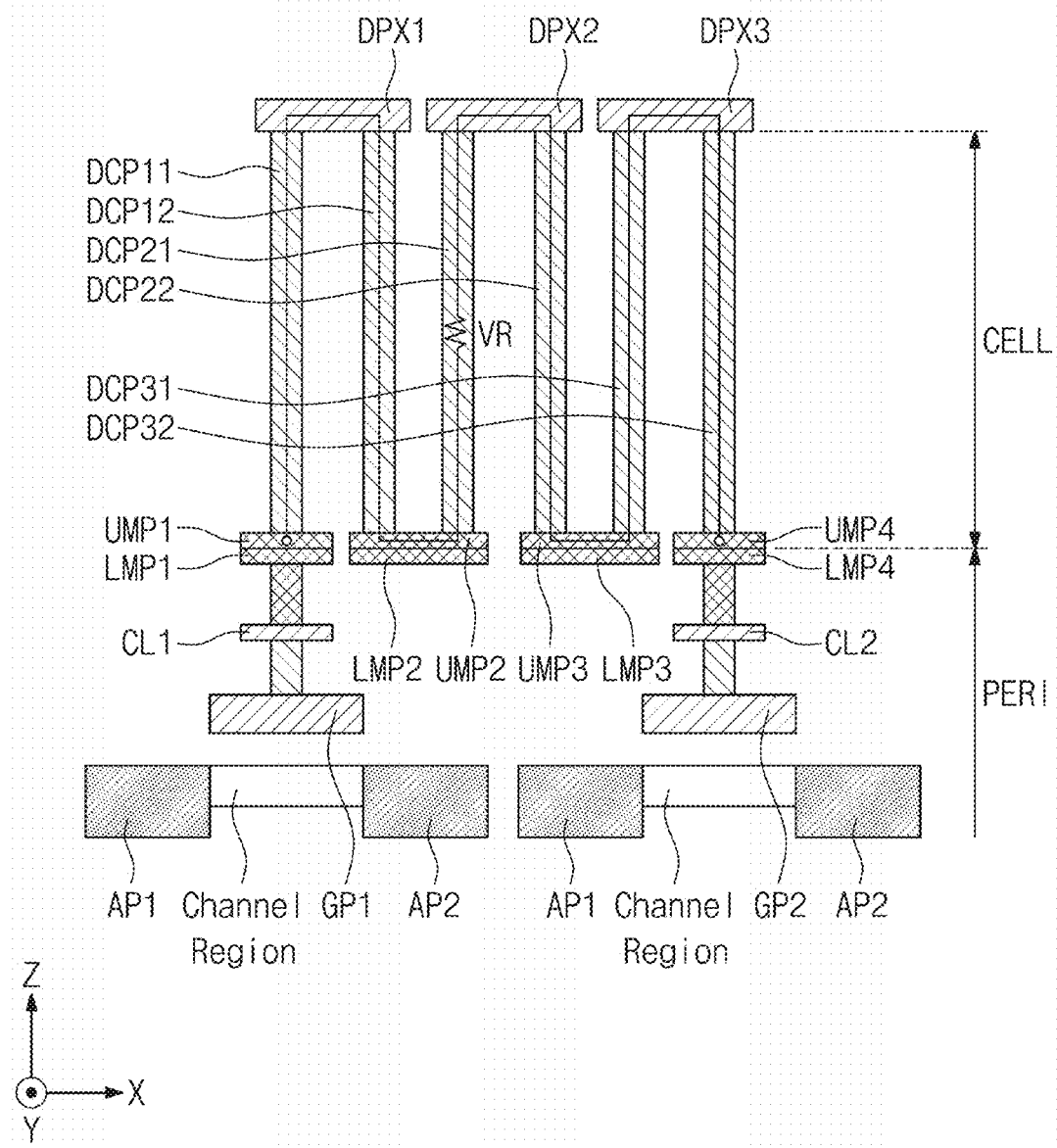

FIGS. 13 and 14 are views illustrating an example of a vertical resistor structure formed by a dummy pad DPX and a dummy contact plug DCP according to an example embodiment of the present disclosure. FIG. 13 is a plan view of the vertical resistor structure, and FIG. 14 is a sectional view of the vertical resistor structure.

Referring to FIGS. 13 and 14, first and second active patterns AP1 and AP2 may be defined in a peripheral circuit region PERI, and a channel region may be defined between the first and second active patterns AP1 and AP2.

In the peripheral circuit region PERI, first and second gate patterns GP1 and GP2 may be provided, and first and second conductive lines CL1 and CL2 may be disposed over the first and second gate patterns GP1 and GP2, respectively. The first and second conductive lines CL1 and CL2 may be formed in the same metal layer and may be spaced apart from each other in the second direction (e.g., the X-axis direction).

In FIGS. 13 and 14, only the first and second conductive lines CL1 and CL2 formed in one metal layer are illustrated and described. However, without being limited thereto, one or more metal layers may be further formed on the metal layer in which the first and second conductive lines CL1 and CL2 are formed.

Lower metal patterns LMP1 to LMP4 having the same shape as upper metal patterns UMP1 to UMP4 of a cell region CELL may be formed in the uppermost metal layer of the peripheral circuit region PERI. The first and fourth lower metal patterns LMP1 and LMP4 may be electrically connected to the first and second conductive lines CL1 and CL2 through contacts, respectively. Contacts may not be formed under the second and third lower metal patterns LMP2 and LMP3.

Dummy pads DPX1, DPX2, and DPX3 may be spaced apart from each other in the second direction (e.g., the X-axis direction). In the cell region CELL, dummy contact plugs DCP11, DCP12, DCP21, DCP22, DCP31, and DCP32 may be provided and may extend in the third direction (e.g., the Z-axis direction) perpendicular or substantially perpendicular to the second direction. For example, referring to FIGS. 13 and 14, two dummy contact plugs may be disposed to correspond to one dummy pad.

The dummy contact plugs may be electrically connected to the dummy pads and the upper metal patterns to provide one vertical resistor VR. In particular, the vertical resistor VR may form a zigzag pattern in the third direction (e.g., the X-axis direction) and thus may have higher resistance.

For example, the two dummy contact plugs DCP11 and DCP12 having first ends commonly connected to the first dummy pad DPX1 and second ends connected to the first upper metal pattern UMP1 and the second upper metal pattern UMP2, respectively, may be disposed. Furthermore, the two dummy contact plugs DCP21 and DCP22 having first ends commonly connected to the second dummy pad DPX2 and second ends connected to the second upper metal pattern UMP2 and the third upper metal pattern UMP3, respectively, may be disposed. In addition, the two dummy contact plugs DCP31 and DCP32 having first ends commonly connected to the third dummy pad DPX3 and second ends connected to the third upper metal pattern UMP3 and the fourth upper metal pattern UMP4, respectively, may be disposed.

As described above, the vertical resistor structure PE6 according to some example embodiments may provide high resistance by forming one electrical connection path from the first upper metal pattern UMP1 to the fourth upper metal pattern UMP4 and forming the zigzag pattern in the third direction (e.g., the Z-axis direction).

Figure 15:
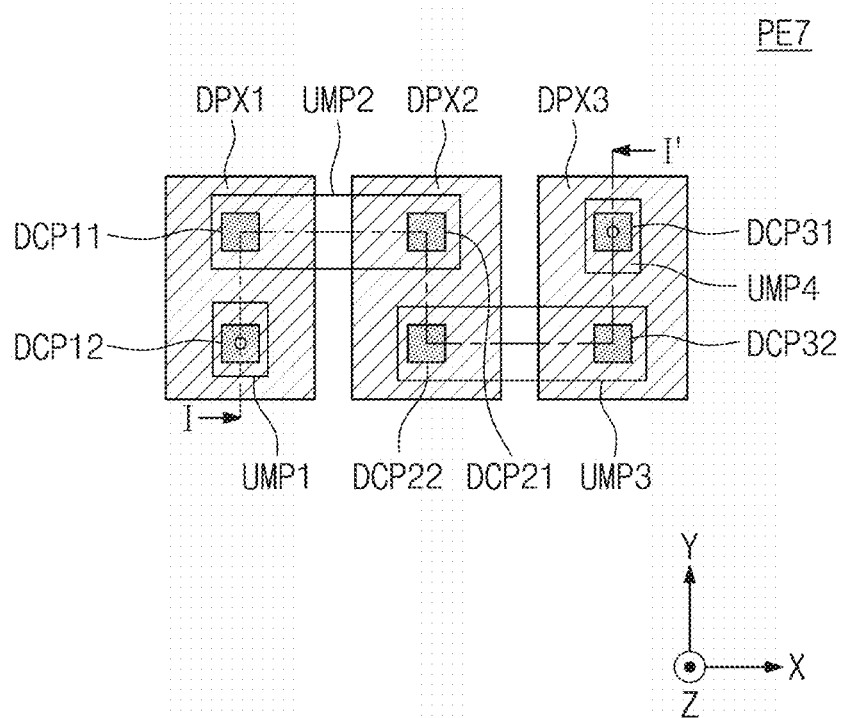
FIGS. 15 and 16 are views illustrating a vertical resistor structure according to another example embodiment of the inventive concepts.
Figure 16:
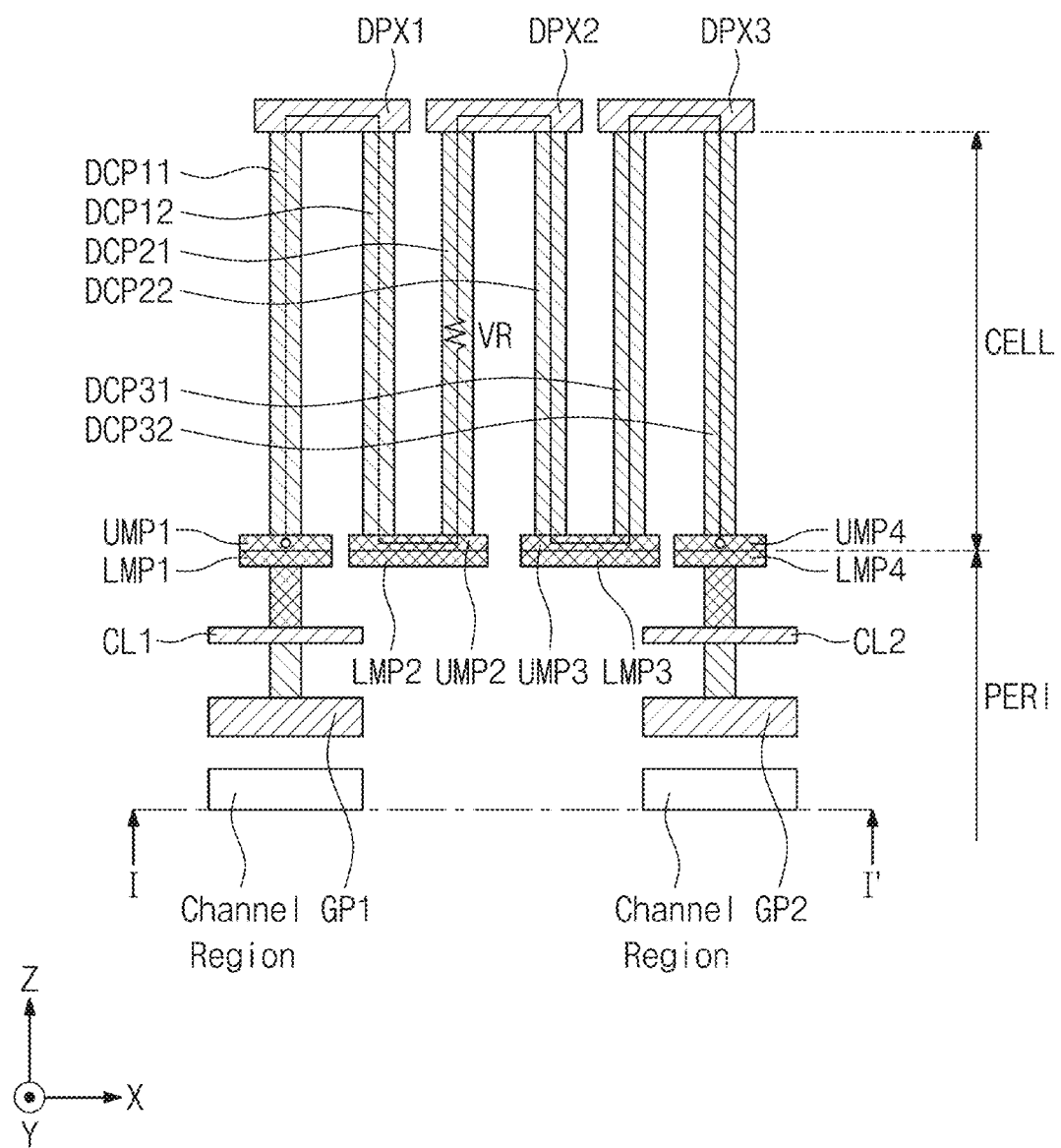

FIGS. 15 and 16 are views illustrating a vertical resistor structure according to another example embodiment of the present disclosure. FIG. 15 is a plan view of the vertical resistor structure, and FIG. 16 is a sectional view of the vertical resistor structure taken along line I-I' of FIG. 15. The vertical resistor structure PE7 illustrated in FIGS. 15 and 16 is similar to the vertical resistor structure PE6 illustrated in FIGS. 13 and 14. Accordingly, identical or similar components will be assigned with identical or similar reference numerals, and repetitive descriptions will hereinafter be omitted for the sake of brevity.

Referring to FIGS. 15 and 16, the vertical resistor structure PE7 according to this example embodiment may provide a resistor having a zigzag pattern not only in a vertical direction and but also in a horizontal direction. Accordingly, an electrical connection path from a first upper metal pattern UMP1 to a fourth upper metal pattern UMP4 may be elongated, and thus higher resistance may be provided.

In more detail, a plurality of dummy pads DPX1 to DPX3 may be spaced apart from each other in the second direction (e.g., the X-axis direction). At least one dummy contact plug may be disposed to correspond to each of the plurality of dummy pads DPX1 to DPX3. For example, two dummy contact plugs may be electrically connected to each of the plurality of dummy pads DPX1 to DPX3, and dummy contact plugs corresponding to one dummy pad may be disposed in the first direction (e.g., the Y-axis direction) perpendicular or substantially perpendicular to the second direction.

The upper metal patterns UMP1, UMP2, UMP3, and UMP4 may be spaced apart from each other in the horizontal direction. Furthermore, at least one of the upper metal patterns UMP1, UMP2, UMP3, and UMP4 may extend in the second direction (e.g., the X-axis direction) and may electrically connect two dummy contact plugs adjacent to each other. For example, dummy contact plugs DCP11 and DCP21 may be electrically connected by the second upper metal pattern UMP2, and dummy contact plugs DCP22 and DCP32 may be electrically connected by the third upper metal pattern UMP3.

Accordingly, the vertical resistor structure PE7 according to some example embodiments may provide the resistor having the zigzag pattern not only in the vertical direction and but also in the horizontal direction. As a result, the electrical connection path from the first upper metal pattern UMP1 to the fourth upper metal pattern UMP4 may be elongated, and thus higher resistance may be provided.

Figure 17:
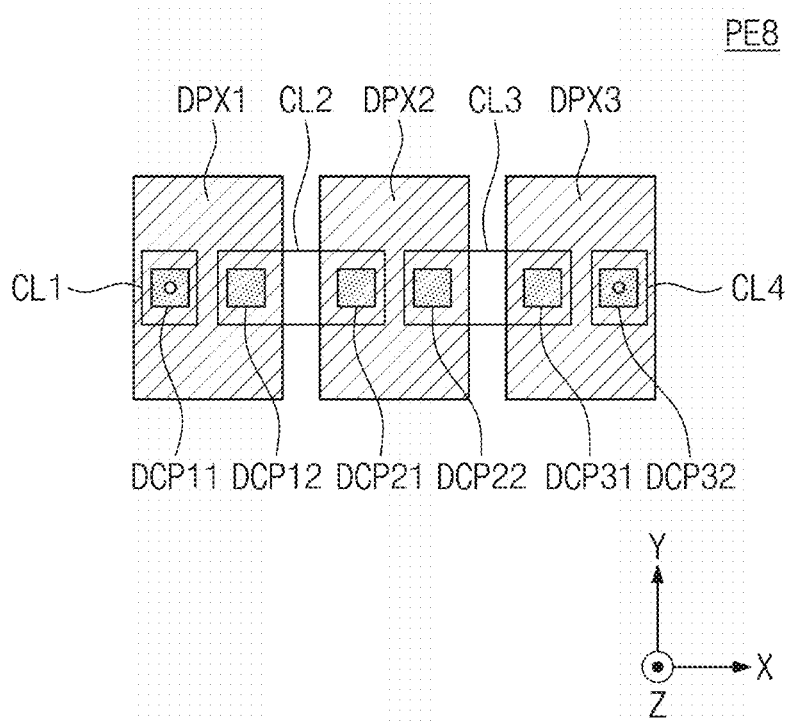
FIGS. 17 and 18 are views illustrating a vertical resistor structure according to another example embodiment of the inventive concepts.
Figure 18:
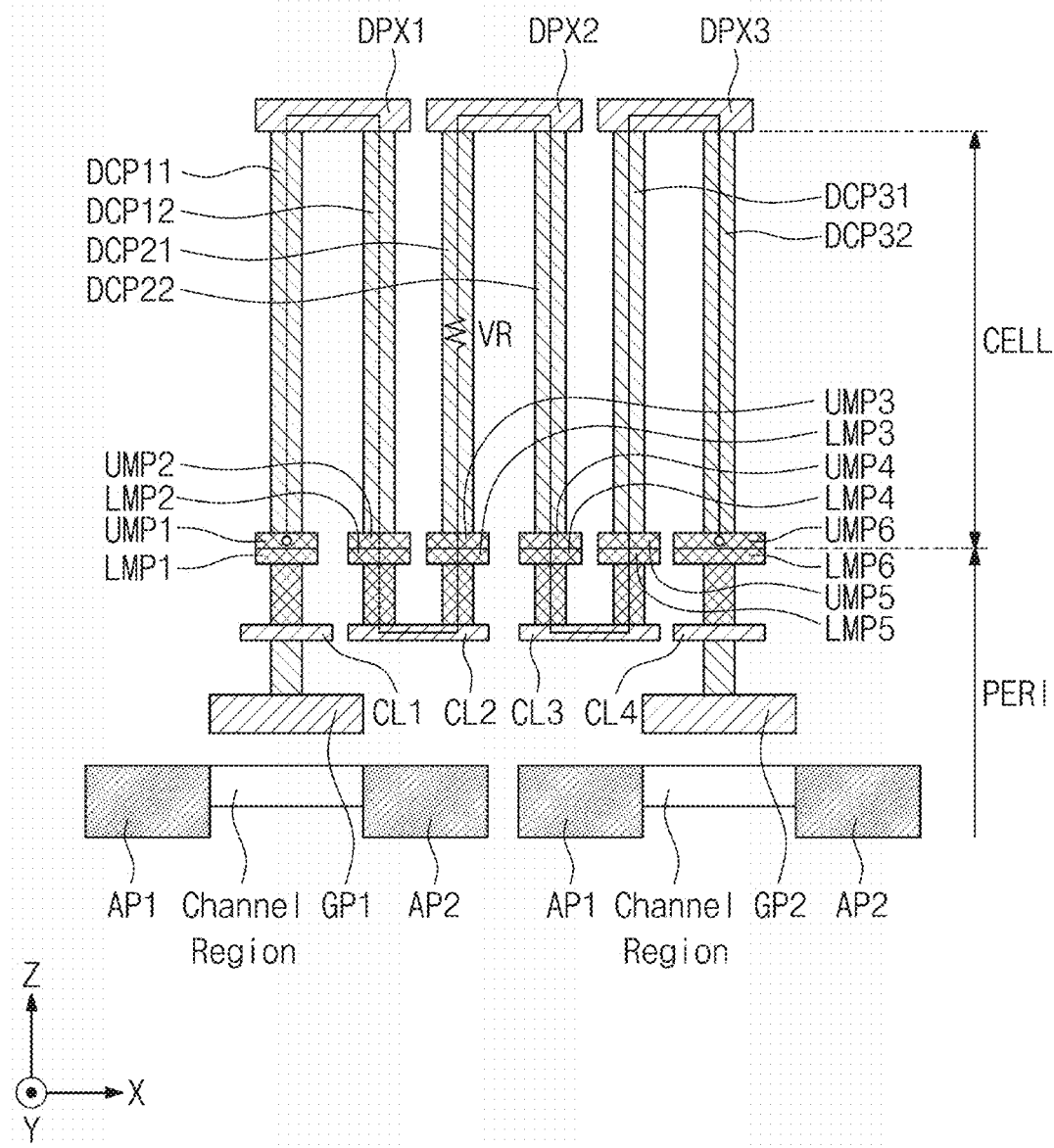

FIGS. 17 and 18 are views illustrating a vertical resistor structure according to another example embodiment of the present disclosure. FIG. 17 is a plan view of the vertical resistor structure, and FIG. 18 is a sectional view of the vertical resistor structure taken along line I-I' of FIG. 17. The vertical resistor structure PE8 illustrated in FIGS. 17 and 18 is similar to the vertical resistor structure PE6 illustrated in FIGS. 13 and 14. Accordingly, identical or similar components will be assigned with identical or similar reference numerals, and repetitive descriptions will hereinafter be omitted for the sake of brevity.

Referring to FIGS. 17 and 18, the vertical resistor structure PE8 according to this example embodiment may provide a resistor having an electrical connection path extending not only to a cell region CELL but also to a peripheral circuit region PERI. In some example embodiments, two dummy contact plugs adjacent to each other may be electrically connected by a conductive line formed in the peripheral circuit region PERI. Accordingly, an electrical connection path from a first upper metal pattern UMP1 to a sixth upper metal pattern UMP6 may be elongated, and thus higher resistance may be provided.

In more detail, first to fourth conductive lines CL1 to CL4 may be provided in the peripheral circuit region PERI. The first to fourth conductive lines CL1 to CL4 may be formed in the same metal layer and may be spaced apart from each other in the second direction (e.g., the X-axis direction). Among the first to fourth conductive lines CL1 to CL4, the first and fourth conductive lines CL1 and CL4 may be disposed over first and second gate patterns GP1 and GP2, respectively.

Lower metal patterns LMP1 to LMP6 having the same or substantially the same shape as the upper metal patterns UMP1 to UMP6 of the cell region CELL may be formed in the uppermost metal layer of the peripheral circuit region PERI. The first and sixth lower metal patterns LMP1 and LMP6 may be electrically connected to the first and fourth conductive lines CL1 and CL4 through contacts, respectively. The second and third lower metal patterns LMP2 and LMP3 may be commonly connected to the second conductive line CL2 through contacts, and the fourth and fifth lower metal patterns LMP4 and LMP5 may be commonly connected to the third conductive line CL3 through contacts.

In the cell region CELL, dummy contact plugs DCP11, DCP12, DCP21, DCP22, DCP31, and DCP32 may be provided and may extend in the third direction (e.g., the Z-axis direction) perpendicular or substantially perpendicular to the second direction. For example, referring to FIGS. 17 and 18, two dummy contact plugs may be disposed to correspond to one dummy pad.

The upper metal patterns UMP1 to UMP6 may be formed in the uppermost metal layer of the cell region CELL, and one dummy contact plug may be electrically connected to one upper metal pattern. For example, the dummy contact plugs DCP11, DCP12, DCP21, DCP22, DCP31, and DCP32 may be electrically connected to the upper metal patterns UMP1, UMP2, UMP3, UMP4, UMP5, and UMP6, respectively.

In some example embodiments, a vertical resistor VR may be formed by using not only the dummy pads and the dummy contact plugs of the cell region CELL but also the conductive lines of the peripheral circuit region PERI. The vertical resistor VR may be formed in a zigzag pattern over the cell region CELL and the peripheral circuit region PERI, and thus higher resistance may be provided.

Figure 19:
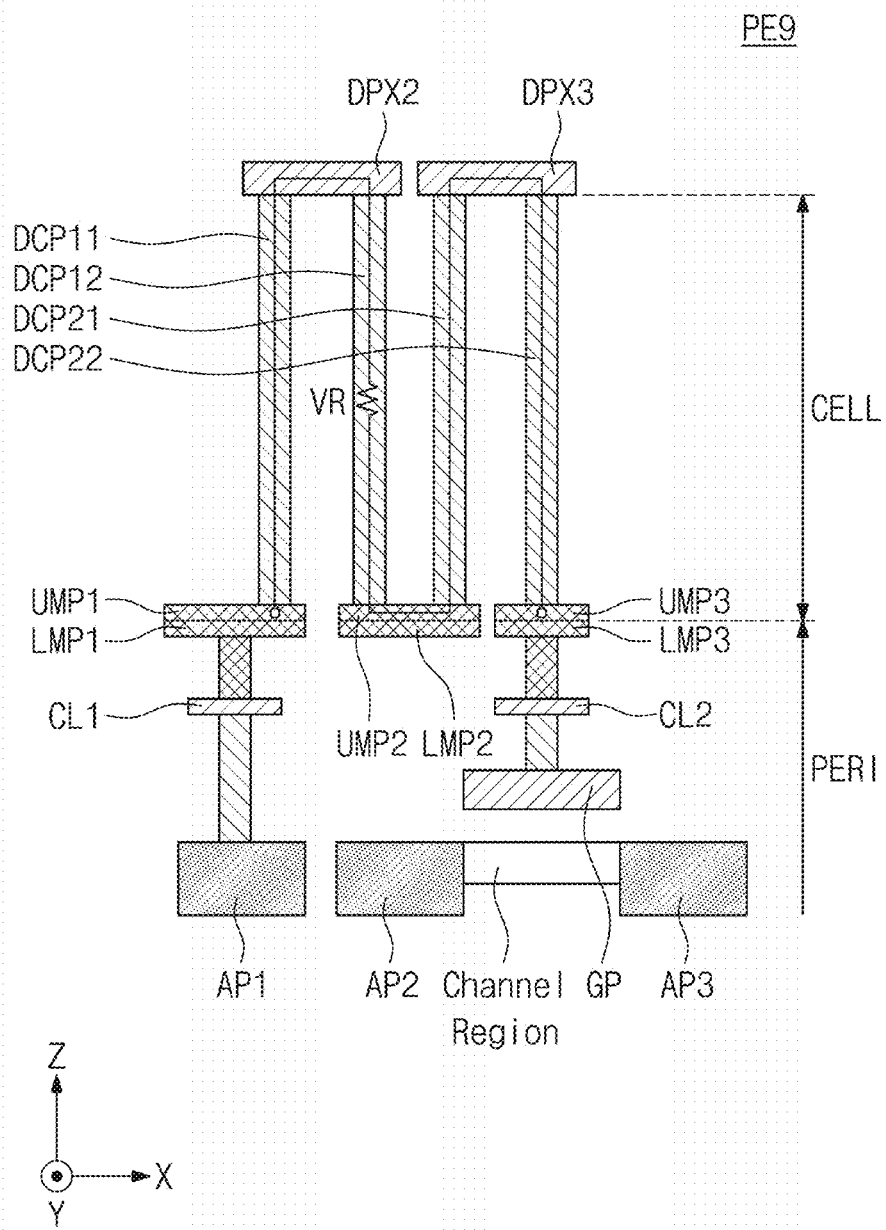
FIG. 19 is a sectional view illustrating a vertical resistor structure according to another example embodiment of the inventive concepts.

FIG. 19 is a sectional view illustrating a vertical resistor structure according to another example embodiment of the present disclosure.

In the vertical resistor structures PE6 to PE8 illustrated in FIGS. 12 to 18, channel regions are disposed under opposite ends of each of the vertical resistors VR. However, this is illustrative, and example embodiments of the inventive concepts are not limited thereto. For example, as illustrated in FIG. 19, a channel region may be disposed under at least one of opposite ends of a vertical resistor VR.

In more detail, referring to FIG. 19, first to third active patterns AP1 to AP3 may be defined in a peripheral circuit region PERI, and a channel region may be defined between the second and third active patterns AP2 and AP3.

First and second conductive lines CL1 and CL2 may be disposed over the first active pattern AP1 and a gate pattern GP, respectively. The first and second conductive lines CL1 and CL2 may be formed in the same metal layer and may be spaced apart from each other in the second direction (e.g., the X-axis direction).

Lower metal patterns LMP1 to LMP3 having the same or substantially the same shape as upper metal patterns UMP1 to UMP3 of a cell region CELL may be formed in the uppermost metal layer of the peripheral circuit region PERI. The first and third lower metal patterns LMP1 and LMP3 may be electrically connected to the first and second conductive lines CL1 and CL2 through contacts, respectively. A contact may not be formed under the second lower metal pattern LMP2.

Dummy pads DPX1 and DPX2 may be spaced apart from each other in the second direction (e.g., the X-axis direction). In the cell region CELL, dummy contact plugs DCP11, DCP12, DCP21, and DCP22 may be provided and may extend in the third direction (e.g., the Z-axis direction) perpendicular or substantially perpendicular to the second direction.

For example, two dummy contact plugs may be disposed to correspond to one dummy pad. For example, first ends of the two dummy contact plugs DCP11 and DCP12 may be commonly connected to the first dummy pad DPX1, and second ends of the two dummy contact plugs DCP11 and DCP12 may be connected to the first upper metal pattern UMP1 and the second upper metal pattern UMP2, respectively. First ends of the two dummy contact plugs DCP21 and DCP22 may be commonly connected to the second dummy pad DPX2, and second ends of the two dummy contact plugs DCP21 and DCP22 may be connected to the second upper metal pattern UMP2 and the third upper metal pattern UMP3, respectively.

As described above, the vertical resistor structure PE9 according to some example embodiments may provide the vertical resistor VR having a zigzag pattern in the third direction (e.g., the Z-axis direction), and an active pattern may be disposed under at least one of the opposite ends of the vertical resistor.

Figure 20:
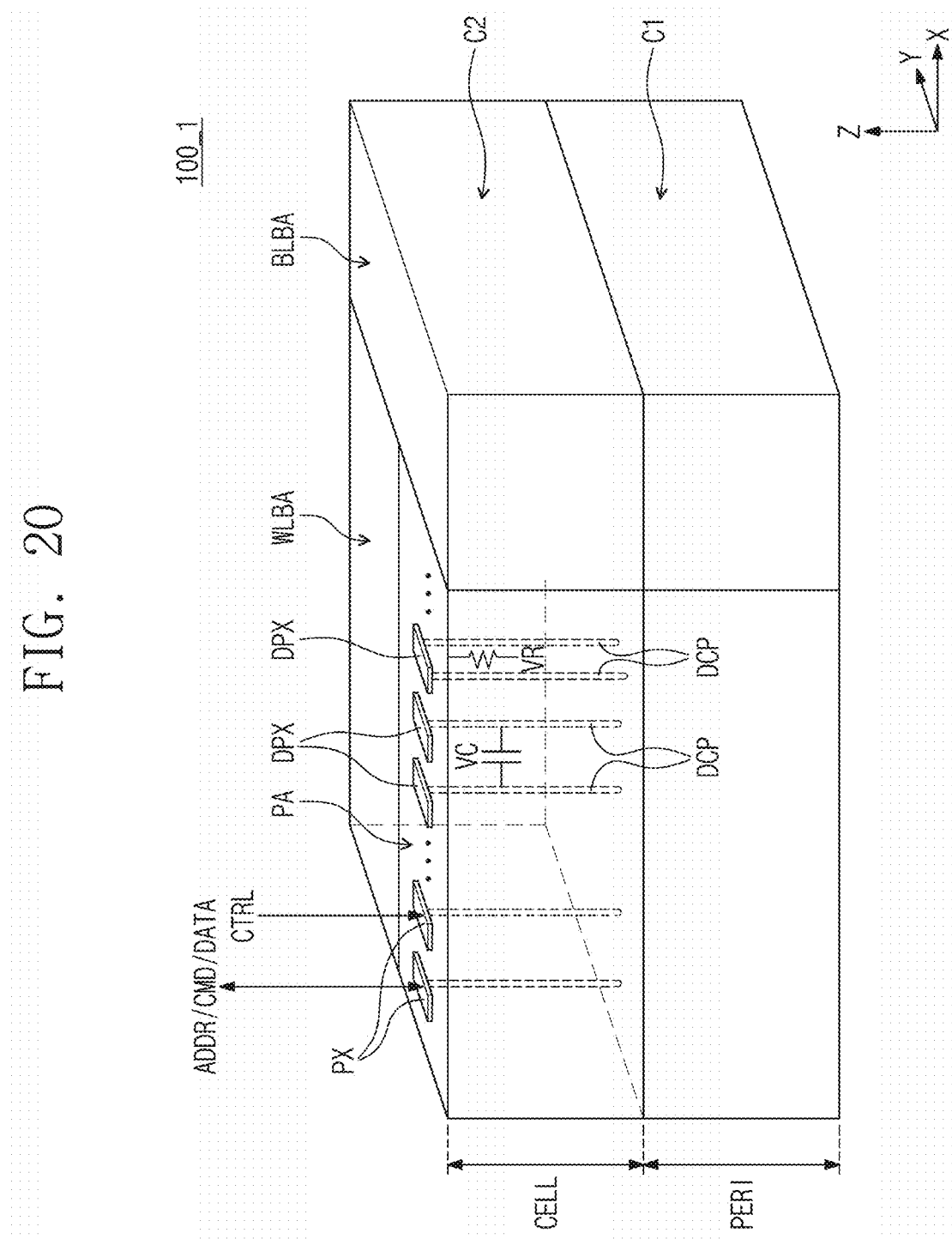
FIG. 20 is a perspective view illustrating a non-volatile memory device according to another example embodiment of the inventive concepts.

FIG. 20 is a perspective view illustrating a non-volatile memory device 100_1 according to another example embodiment of the present disclosure.

The external pad bonding region PA of the non-volatile memory device 100 of FIG. 3 is disposed on one side of the word line bonding region WLBA in the second direction (e.g., the X-axis direction). However, this is illustrative, and example embodiments of the inventive concepts are not limited thereto.

In some example embodiments, as illustrated in FIG. 20, an external pad bonding region PA may be disposed in front of a word line bonding region WLBA when viewed in the first direction (e.g., the Y-axis direction). Furthermore, although not illustrated, an external pad bonding region PA may be disposed in front of a bit line bonding region BLBA when viewed in the first direction (e.g., the Y-axis direction).

Figure 21:
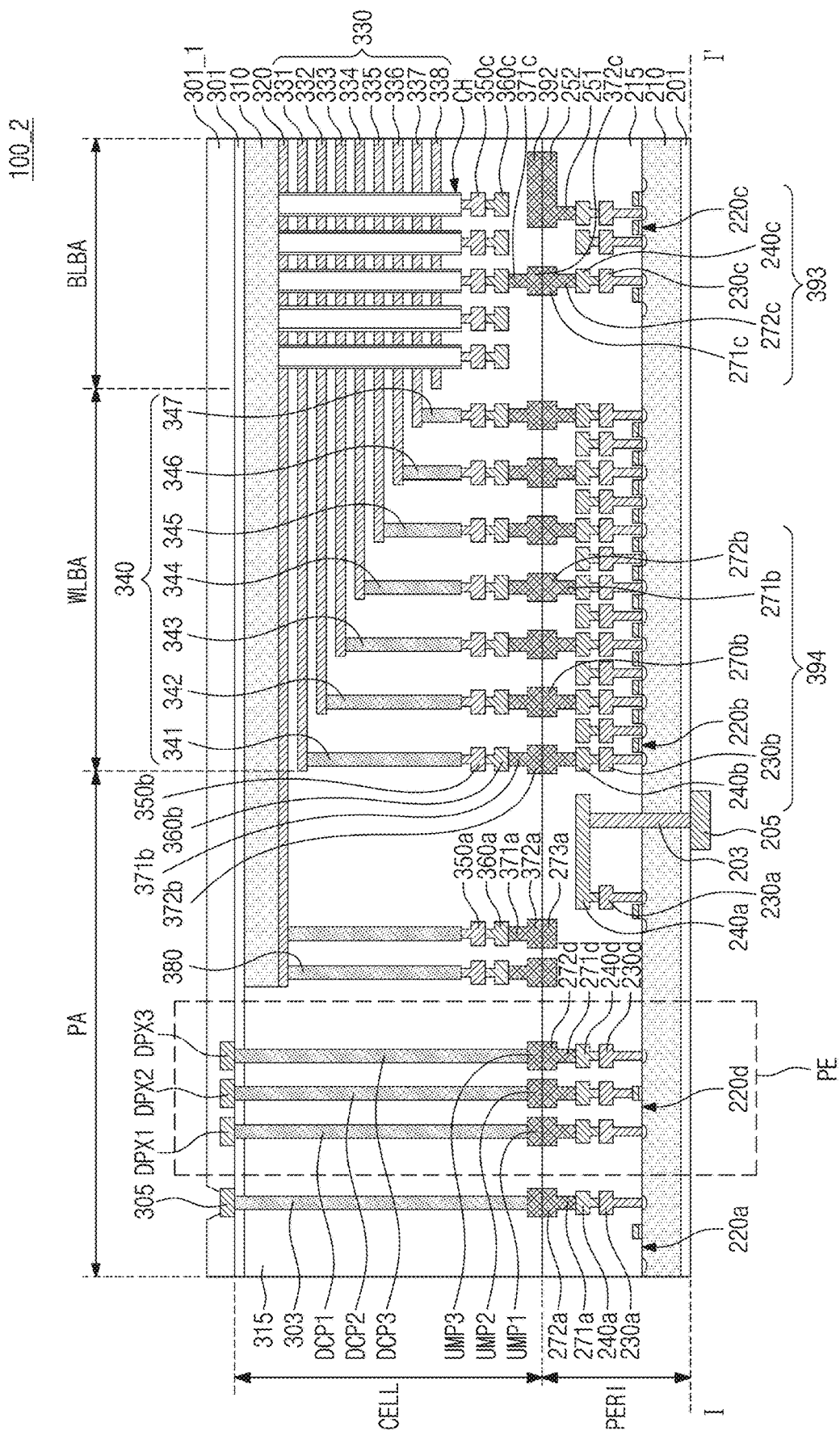
FIG. 21 is a sectional view illustrating a non-volatile memory device according to another example embodiment of the inventive concepts.

FIG. 21 is a sectional view illustrating a non-volatile memory device 100_2 according to another example embodiment of the inventive concepts.

Referring to FIG. 21, a cover layer 301_1 may be further formed on an upper insulating layer 301 of the non-volatile memory device 100_2. For example, the cover layer 301_1 may be formed of the same or substantially the same insulating material as that of the upper insulating layer 301 or a lower insulating layer 201.

A pad open may be formed in the cover layer 301_1. The pad open may be formed in a position corresponding to a second input/output pad 305 and may expose the second input/output pad 305 to the outside. In other words, a pad open may not be formed in a position corresponding to dummy pads DPX1, DPX2, and DPX3, and thus the dummy pads DPX1, DPX2, and DPX3 may not be exposed to the outside by the cover layer 301_1. Likewise, although not illustrated, the non-volatile memory devices 100_1 and 100_2 of FIGS. 12 and 20 may also further include cover layers formed on the upper insulating layers, respectively, and thus the dummy pads may not be exposed to the outside.

Figure 22:
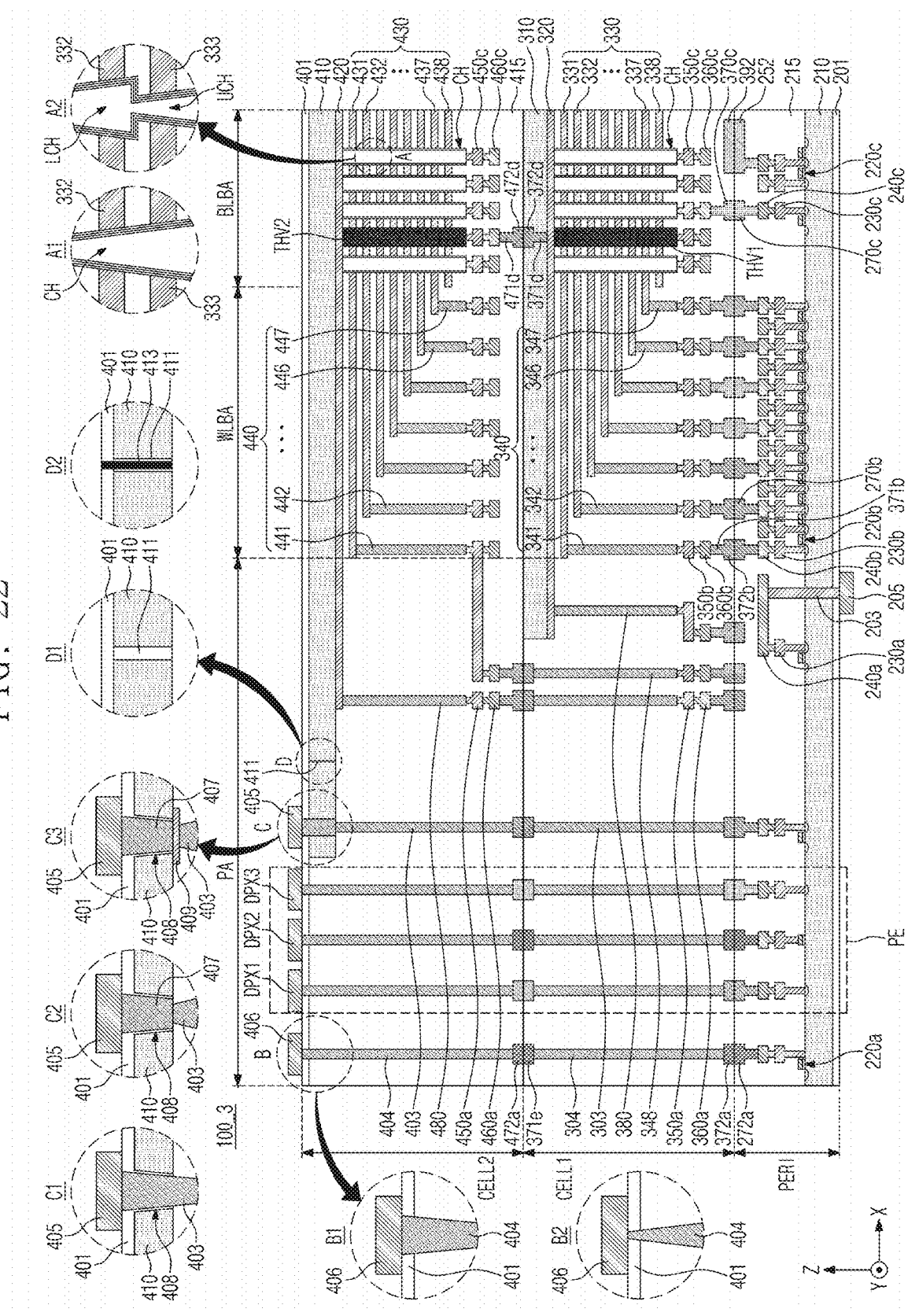
FIG. 22 is a sectional view illustrating a non-volatile memory device according to another example embodiment of the inventive concepts.

FIG. 22 is a view illustrating a memory device 100_3 according to some example embodiments of the inventive concepts.

Referring to FIG. 22, the memory device 100_3 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W), but example embodiments are not limited thereto.

The memory device 100_3 may include the at least one upper chip including the cell region. For example, as illustrated in FIG. 22, the memory device 100_3 may include two upper chips. However, the number of the upper chips is not limited thereto. In some example embodiments the memory device 100_3 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 100_3. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 22. However, example embodiments of the inventive concepts are not limited thereto. In some example embodiments, one of the first upper chip and the second upper chip may be turned over and then may be connected to a corresponding chip by the bonding method.

Each of the peripheral circuit region PERI and the first and second cell regions CELL1 and CELL2 of the memory device 100_3 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in some example embodiments. However, example embodiments of the inventive concepts are not limited thereto. In some example embodiments, at least one or more additional metal lines may further be formed on the second metal lines 240a, 240b and 240c. In some example embodiments, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (e.g., the Z-axis direction) perpendicular or substantially perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (e.g., 431, 432 to 437, 438) may be stacked on the third substrate 410 in a direction (e.g., the Z-axis direction) perpendicular or substantially perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate, but example embodiments are not limited thereto. A plurality of channel structures CH may be formed in each of the first and second cell regions CELL1 and CELL2.

In some example embodiments, as illustrated in a region 'A1', the channel structure CH may be provided in the bit line bonding region BLBA and may extend in the direction perpendicular or substantially perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel or substantially parallel to the top surface of the second substrate 310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular or substantially perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 100_3 according to some example embodiments may include a channel having improved width uniformity due to the lower channel LCH and the upper channel UCH which are formed by the processes performed sequentially.

In some example embodiments the channel structure CH includes the lower channel LCH and the upper channel UCH as illustrated in the region 'A2', and a word line located near to a boundary between the lower channel LCH and the upper channel UCH may be a dummy word line. For example, the word lines 332 and 333 adjacent to the boundary between the lower channel LCH and the upper channel UCH may be the dummy word lines. In some example embodiments, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, example embodiments of the inventive concepts are not limited thereto. In some example embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 22, the first through-electrode THV1 may penetrate the common source line 320 and the plurality of word lines 330. In some example embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some example embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 22, in the word line bonding region WLBA, the word lines 330 of the first cell region CELL1 may extend in a second direction (e.g., an X-axis direction) parallel or substantially parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 372*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 372*b* of the first cell region CELL1 and the upper bonding metal patterns 270*b* of the peripheral circuit region PERI. In some example embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel or substantially parallel to the top surface of the third substrate 410 and may be connected to a plurality of cell contact plugs 440 (e.g., 441, 442 to 446, 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 372b may be formed in the first cell region CELL1, and the upper bonding metal patterns 270b may be formed in the peripheral circuit region PERI. The upper bonding metal patterns 372b of the first cell region CELL1 and the upper bonding metal patterns 270b of the peripheral circuit region PERI may be electrically connected to each other by the bonding method. The upper bonding metal patterns 372b and the upper bonding metal patterns 270b may be formed of aluminum, copper, or tungsten, but example embodiments are not limited thereto.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped poly-silicon, but example embodiments are not limited thereto. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2. The second cell region CELL2 may include a first metal line 450c and a second metal line 460c.

Input/output pads 205, 405 and 406 may be disposed in the external pad bonding region PA. Referring to FIG. 22, a lower insulating layer 201 may cover a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some example embodiments, the third substrate 410 may not be disposed in a region in which the input/output contact plug is disposed. For example, as illustrated in a region the third input/output contact plug 404 may be separated from the third substrate 410 in a direction parallel or substantially parallel to the top surface of the third substrate 410 and may penetrate an interlayer insulating layer 415 of the second cell region CELL2 so as to be connected to the third input/output pad 406. In some example embodiments, the third input/output contact plug 404 may be formed by at least one of various processes.

In some example embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some example embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some example embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In some example embodiments, a connection structure of the second input/output contact plug 403 and the second input/output pad 405 may be realized by various methods.

In some example embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In some example embodiments, as illustrated in the region 'C1', a diameter of the second input/output contact plug 403 may become progressively greater toward the second input/output pad 405. However, example embodiments of the inventive concepts are not limited thereto, and in some example embodiments, the diameter of the second input/output contact plug 403 may become progressively less toward the second input/output pad 405.

In some example embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In some example embodiments, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some example embodiments illustrated in a region 'C3', a stopper 409 may further be formed on a bottom end of the opening 408 of the third substrate 410, as compared with the example embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

Meanwhile, in some example embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some example embodiments, as illustrated in a region 'D1', the slit 411 may be formed to penetrate the third substrate 410. For example, the slit 411 may be used to inhibit or prevent the third substrate 410 from being finely cracked when the opening 408 is formed. However, example embodiments of the inventive concepts are not limited thereto, and in some example embodiments, the slit 411 may be formed to have a depth ranging from about 60% to about 70% of a thickness of the third substrate 410.

In some example embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In some example embodiments, the conductive material 412 may be connected to an external ground line.

In some example embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to inhibit or prevent a voltage provided through the second input/output pad 405 from affecting a metal layer disposed on the third substrate 410 in the word line bonding region WLBA.

Meanwhile, in some example embodiments, the first to third input/output pads 205, 405 and 406 may be selectively formed. For example, the memory device 100_3 may be realized to include only the first input/output pad 205 disposed on the first substrate 210, to include only the second input/output pad 405 disposed on the third substrate 410, or to include only the third input/output pad 406 disposed on the upper insulating layer 401.

In some example embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

In an example embodiment of the inventive concepts, a vertical capacitor VC or a vertical resistor VR may be formed to penetrate the first cell region CELL1 and the second cell region CELL2. For example, as illustrated in FIG. 22, dummy pads DPX1, DPX2, and DPX3 may be formed on the upper insulating layer 401 and may be formed so as not to overlap the third substrate 410. In this case, dummy contact plugs may be formed to penetrate the upper insulating layer 401, the first cell region CELL1, and the second cell region CELL2. That is, the vertical capacitor VC or the vertical resistor VR may be formed to penetrate the upper insulating layer 401, the first cell region CELL1, and the second cell region CELL2. In another example embodiment, the dummy pads DPX1, DPX2, and DPX3 may be formed on the upper insulating layer 401 and may be formed to overlap the third substrate 410. In some example embodiments, dummy contact plugs penetrating the first and second cell regions CELL1 and CELL2 may be connected to the dummy pads DPX1, DPX2, and DPX3 through contacts penetrating the third substrate 410 and the upper insulating layer 401. Since the vertical capacitor VC or the vertical resistor VR is formed to penetrate the first and second cell regions CELL1 and CELL2 as described above, the non-volatile memory device 100_3 may provide a higher-capacity passive element.

Some example non-volatile memory devices according to the inventive concepts may provide a high-capacity passive element while reducing or minimizing an increase in chip size.

The above-described contents are example embodiments of the inventive concepts. The inventive concepts include not only the above-described example embodiments, but also example embodiments that can be made through a simple design change or can be easily modified. Furthermore, the inventive concepts include technologies that can be carried out by easily modifying the example embodiments. Accordingly, the scope of the inventive concepts should not be determined by the above-described example embodiments.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments of the inventive concepts have been described with reference to example embodiments thereof, it will be apparent to those of ordinary skill in the art that various changes and modifications may be made thereto without departing from the scope of the inventive concepts.

What is claimed is:

1. A non-volatile memory device comprising:
    a first chip including a first substrate and a circuit element, the first substrate including a first peripheral circuit region and a second peripheral circuit region, and the circuit element on the first peripheral circuit region of the first substrate; and
    a second chip stacked on the first chip, wherein the second chip includes
        a second substrate including a first cell region and a second cell region, the first cell region configured to overlap the first peripheral circuit region, and the second cell region configured to overlap the second peripheral circuit region,
        gate electrodes stacked on the second cell region of the second substrate, the gate electrodes between the second substrate and the first chip,
    an upper insulating layer configured to cover the second substrate,
        dummy pads and input/output pads on the upper insulating layer,
        a cover layer on the upper insulating layer to cover the dummy pads, the cover layer configured to expose the input/output pads to an outside, and
        dummy contact plugs on one side of the second substrate, the dummy contact plugs configured to penetrate the upper insulating layer and electrically connect the dummy pads and the circuit element.

2. The non-volatile memory device of claim 1, wherein
    the dummy pads include first and second dummy pads spaced apart from each other in a first horizontal direction,
    the dummy contact plugs include first and second dummy contact plugs electrically connected to the first and second dummy pads, respectively,
    the first dummy pad and the first dummy contact plug define a first electrode of a first vertical capacitor, and
    the second dummy pad and the second dummy contact plug define a second electrode of the first vertical capacitor.

3. The non-volatile memory device of claim 2, wherein
    the dummy pads further include a third dummy pad spaced apart from the first and second dummy pads in the first horizontal direction,
    the dummy contact plugs further include a third dummy contact plug connected to the third dummy pad, and
    the second dummy pad and the second dummy contact plug define a first electrode of a second vertical capacitor, and
    the third dummy pad and the third dummy contact plug define a second electrode of the second vertical capacitor.

4. The non-volatile memory device of claim 3, wherein the first peripheral circuit region includes:
    first and second active patterns spaced apart from each other in the first horizontal direction;
    a gate pattern over a channel region, the gate pattern between the first active pattern and the second active pattern;
    a first capacitor electrode configured to make contact with the first active pattern and receive a first voltage;
    a second capacitor electrode configured to make contact with the gate pattern and receive a second voltage, the second voltage different from the first voltage; and
    a third capacitor electrode configured to contact the second active pattern and receive the first voltage,
    wherein the first dummy pad and the first dummy contact plug are electrically connected with the first capacitor electrode,
    wherein the second dummy pad and the second dummy contact plug are electrically connected with the second capacitor electrode, and
    wherein the third dummy pad and the third dummy contact plug are electrically connected with the third capacitor electrode.

5. The non-volatile memory device of claim 4, wherein
the first chip further includes a first lower bonding pattern, a second lower bonding pattern and a third lower bonding pattern spaced apart from each other,
the first lower bonding pattern is over the first capacitor electrode and electrically connected to the first capacitor electrode,
the second lower bonding pattern is over the second capacitor electrode and electrically connected to the second capacitor electrode,
the third lower bonding pattern is over the third capacitor electrode and electrically connected to the third capacitor electrode,
the second chip further includes a first upper bonding pattern connected to the first lower bonding pattern, a second upper bonding pattern connected to the second lower bonding pattern, and a third upper bonding pattern connected to the third lower bonding pattern, and
the first upper bonding pattern is configured to electrically connect the first dummy contact plug to the first lower bonding pattern, the second upper bonding pattern is configured to electrically connect the first dummy contact plug to the first lower bonding pattern, and the third upper bonding pattern is configured to electrically connect the third dummy contact plug to the third lower bonding pattern.

6. The non-volatile memory device of claim 4, wherein the first chip further includes:
a first conductive line on the first capacitor electrode and the third capacitor electrode; and
a second conductive line spaced apart from the first conductive line in the first horizontal direction, the second conductive line on the second capacitor electrode,
wherein the first conductive line is configured to receive the first voltage, and the second conductive line is configured to receive the second voltage.

7. The non-volatile memory device of claim 4, wherein the first chip further includes:
a first bonding pattern over the first capacitor electrode and the third capacitor electrode; and
a second bonding pattern spaced apart from the first bonding pattern in the first horizontal direction, the second bonding pattern over the second capacitor electrode,
wherein the first bonding pattern is configured to receive the first voltage, and the second bonding pattern is configured to receive the second voltage.

8. The non-volatile memory device of claim 1, wherein
the dummy pads include first and second dummy pads spaced apart from each other in a first horizontal direction,
the dummy contact plugs include first and second dummy contact plugs spaced apart from each other in a second horizontal direction,
the second horizontal direction is different from the first horizontal direction,
the first and second dummy contact plugs are electrically connected to the first dummy pad, and
the dummy contact plugs include a third dummy contact plug electrically connected to the second dummy pad.

9. The non-volatile memory device of claim 8, wherein the dummy contact plugs further include a fourth dummy contact plug spaced apart from the third dummy contact plug in the second horizontal direction, and the fourth dummy contact plug is electrically connected to the second dummy pad.

10. The non-volatile memory device of claim 1, wherein
the dummy pads include first and second dummy pads spaced apart from each other in a first horizontal direction,
the dummy contact plugs include first and second dummy contact plugs electrically connected to the first dummy pad,
the dummy contact plugs include third and fourth dummy contact plugs electrically connected to the second dummy pad, and
the second dummy contact plug and the third dummy contact plug are electrically connected with each other through a bonding metal pattern at a top of the second chip.

11. The non-volatile memory device of claim 10, wherein
the first and second dummy contact plugs are spaced apart from each other in a second horizontal direction perpendicular to the first horizontal direction,
the third and fourth dummy contact plugs are spaced apart from each other in the second horizontal direction, and
the bonding metal pattern extends in the first horizontal direction and electrically connects the second dummy contact plug and the third dummy contact plug.

12. The non-volatile memory device of claim 1, wherein
the dummy pads include first and second dummy pads spaced apart from each other in a first horizontal direction,
the dummy contact plugs include first and second dummy contact plugs electrically connected to the first dummy pad,
the dummy contact plugs include third and fourth dummy contact plugs electrically connected to the second dummy pad,
the first chip further includes a first conductive line electrically connected with the first dummy contact plug,
the first chip includes a second conductive line spaced apart from the first conductive line in the first horizontal direction, and the second conductive line is electrically connected to the second and third dummy contact plugs, and
the first chip includes a third conductive line spaced apart from the second conductive line in the first horizontal direction, and the third conductive line is electrically connected to the fourth dummy contact plug.

13. A non-volatile memory device comprising:
a first chip including a first substrate, a circuit element and first bonding metals, the first substrate including a first peripheral circuit region and a second peripheral circuit region, the circuit element on the first peripheral circuit region of the first substrate, the first bonding metals over the first peripheral circuit region of the first substrate, and the first bonding metals electrically connected to the circuit element; and
a second chip stacked on the first chip, wherein the second chip includes
a second substrate including a first cell region and a second cell region, the first cell region configured to overlap the first peripheral circuit region, and the second cell region configured to overlap the second peripheral circuit region,
gate electrodes stacked on the second cell region of the second substrate, the gate electrodes located between the second substrate and the first chip, dummy pads and input/output pads on the second substrate, a cover layer on the second substrate to cover the dummy pads, the cover layer configured to expose the input/output pads to an outside, dummy contact plugs configured to penetrate the second substrate and electrically connect the dummy pads and the circuit element, and second bonding metals electrically connected to the dummy contact plugs, the second bonding metals configured to contact the first bonding metals of the first chip.

14. The non-volatile memory device of claim 13, wherein the second chip further includes contacts penetrating the second substrate, and the dummy contact plugs are electrically connected to the dummy pads through the contacts.

15. The non-volatile memory device of claim 13, wherein the dummy pads include first and second dummy pads spaced apart from each other in a first horizontal direction, the dummy contact plugs include first and second dummy contact plugs spaced apart from each other in the first horizontal direction, the first and second dummy contact plugs are connected to the first and second dummy pads, respectively, the first dummy pad and the first dummy contact plug define a first electrode of a vertical capacitor, and the second dummy pad and the second dummy contact plug define a second electrode of the vertical capacitor.

16. The non-volatile memory device of claim 15, wherein the dummy contact plugs further include:

a third dummy contact plug spaced apart from the first dummy contact plug in a second horizontal direction perpendicular to the first horizontal direction, the third dummy contact plug connected to the first dummy pad; and a fourth dummy contact plug spaced apart from the second dummy contact plug in the second horizontal direction, the fourth dummy contact plug connected to the second dummy pad.

17. The non-volatile memory device of claim 15, wherein the dummy pads further include a third dummy pad spaced apart from the first and second dummy pads in the first horizontal direction, the dummy contact plugs further include a third dummy contact plug connected to the third dummy pad, the first chip further includes a first conductive line over the first peripheral circuit region of the first substrate, the first conductive line electrically connected to each of the first and third dummy contact plugs; and the first chip includes a second conductive line in parallel with the first conductive lines, the second conductive line electrically connected to the second dummy contact plug.

18. The non-volatile memory device of claim 13, wherein the dummy pads include first and second dummy pads spaced apart from each other in a first horizontal direction, the dummy contact plugs include first and second dummy contact plugs electrically connected to the first dummy pad, the dummy contact plugs include third and fourth dummy contact plugs electrically connected to the second dummy pad, and at least one of the second bonding metals is electrically connected to the second dummy contact plug and the third dummy contact plug.

19. The non-volatile memory device of claim 13, wherein the dummy pads include first and second dummy pads spaced apart from each other in a first horizontal direction, the dummy contact plugs include first and second dummy contact plugs electrically connected to the first dummy pad, the dummy contact plugs include third and fourth dummy contact plugs electrically connected to the second dummy pad, the first chip further includes a first conductive line over the first peripheral circuit region, the first conductive line electrically connected with the first dummy contact plug, the first chip includes a second conductive line spaced apart from the first conductive line in the first horizontal direction over the first peripheral circuit region, the second conductive line electrically connected to the second and third dummy contact plugs, and the first chip includes a third conductive line spaced apart from the second conductive line in the first horizontal direction over the first peripheral circuit region, the third conductive line electrically connected to the fourth dummy contact plug.

20. The non-volatile memory device of claim 13, further comprising a third chip on the first chip and the second chip, wherein the third chip includes:

a third substrate including a third cell region and a fourth cell region, the third cell region configured to overlap the first peripheral circuit region, and the fourth cell region configured to overlap the second peripheral circuit region;

gate electrodes stacked on the fourth cell region of the third substrate, the gate electrodes between the third substrate and the first chip;

third bonding metals configured to contact the first bonding metals of the first chip;

fourth bonding metals configured to contact the second bonding metals of the second chip; and a plurality of additional dummy contact plugs corresponding to the dummy contact plugs, the plurality of additional dummy contact plugs configured to electrically connect the dummy contact plugs and the circuit element.

* * * * *